(12) United States Patent  (10) Patent No.: US 8,377,323 B2
Vecchione et al.  (45) Date of Patent: Feb. 19, 2013

(54) MOLD HAVING NANOMETRIC FEATURES, METHOD FOR REALIZING SUCH A MOLD AND CORRESPONDING USE OF IT IN A METHOD FOR REALIZING AN ARRAY OF CARBON NANOTUBES

(75) Inventors: Raffaele Vecchione, Naples (IT); Luigi Occhipinti, Ragusa (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 903 days.

(21) Appl. No.: 12/413,688

(22) Filed: Mar. 30, 2009

(65) Prior Publication Data

US 2009/0289029 A1  Nov. 26, 2009

(30) Foreign Application Priority Data

Apr. 1, 2008 (IT) ............................. MI2008A0562

(51) Int. Cl.
  *C23F 1/00* (2006.01)
(52) U.S. Cl. ............... 216/79; 216/26; 216/72; 438/719
(58) Field of Classification Search .................. 216/24, 216/26, 58, 62, 79, 13, 72, 99; 438/706, 438/719, 725, 735
See application file for complete search history.

(56) References Cited

U.S. PATENT DOCUMENTS 5,627,427 A * 5/1997 Das et al. ...................... 313/308
5,666,190 A   9/1997 Quate et al.
6,673,401 B2  1/2004 Black et al. .................. 428/34.1
6,676,748 B1 * 1/2004 Himi et al. ........................ 117/8
7,074,480 B2 * 7/2006 Fukutani et al. ........... 428/312.2

FOREIGN PATENT DOCUMENTS
WO  2008/001670  1/2008

OTHER PUBLICATIONS

Wang et al., "Formation of nanoimprinting mould through use of nanosphere lithography", Journal of Crystal Growth, Feb. 2006, pp. 200-204.
Milne et al., "Carbon nanotubes as field emission sources", J. Mater. Cehm, Feb. 2004, pp. 933-943.
Eleftheriou et al., "Millipede-A MEMS-Based Scanning-Probe Data-Storage System", IEEE, vol. 39, No. 2, Mar. 2003, pp. 938-945.
Choi et al., "Aligned carbon nanotubes for nanoelectronics", Institute of Physics Publishing, Mar. 2004, pp. S512-S516.
Carbon nanotube growth studies at ST Microelectronics, Accelrys, San Diego, CA, pp. 1-2.
Vinciguerra et al., "Growth mechanisms in chemical vapour deposited carbon nanotubes", Institute of Physics Publishing, Nanotechnology 14, 2003, pp. 655-660.
Teo et al., "Plasma enhanced chemical vapour deposition carbon nonotubes/nanofibres-how uniform do they grow?", Institute of Physics Publishing, Nanotechnology 14, 2003, pp. 204-211.
Jankovic et al., "Catalytic production of carbon nanotubes over first row transition metal oxides supported on montmorillonite", Institute of Physics Publishing, 2005, pp. 178-181.

(Continued)

*Primary Examiner* — Lan Vinh
(74) *Attorney, Agent, or Firm* — Allen, Dyer, Doppelt, Milbrath & Gilchrist, P.A.

(57) ABSTRACT

A mold is for obtaining, on a substrate, an array of carbon nanotubes with a high control of their positioning. The mold includes a first layer of a first preset material having a surface having in relief at least one first plurality of projections having a free end portion with a substantially pointed profile.

19 Claims, 25 Drawing Sheets

OTHER PUBLICATIONS

Sato et al., "Growth of diameter-controlled carbon nanotubes using monodisperse nickel nanoparticles obtained with a differential mobility analyzer", Science Direct, Chemical Physics Letters, Aug. 2003, pp. 361-366.

Ago et al., "Dispersion of metal nanoparticles for aligned carbon nanotube arrays", Applied Physics Letters, vol. 77, No. 1, Jul. 2000, pp. 79-81.

Palgrave et al., "Surfactant directed chemical vapour deposition of gold nanoparticles with narrow size distributions", Gold Bulletin 2008, 41/1, pp. 66-69.

Brust et al., "Synthesis of thiol-derivatised gold nanoparticles in a two-phase liquid-liquid system", J. Chem. Soc, 1994, pp. 801-802.

Vinciguerra et al., "Patterned growth of carbon nanotubes synthesized by fe-catalyzed chemical vapour deposition", Chemistry Today, Mar./Apr. 2005, pp. 33-36.

Martinez et al., "Sequential and parallel patterning by local chemical nanolithography", Institute of Physics Publishing, Nanotechnology 18, 2007, pp. 1-6.

Chen, "Nanotubes for nanoelectronics", Encyclopedia of Nanoscience and Nanotechnology, vol. 7, 2004, pp. 919-942.

Kang et al., "Chemical dry etching of silicon oxide in F2/Ar remote plasmas", Science Direct, Thin Solid Film 515, 2007, pp. 4645-4949.

Ray et al., "Rapid plasma etching of silicon, silicon dioxide and silicon nitride using microwave discharges", Semicond. Sci. Technol. 8, 1993, pp. 599-604.

Buhler et al., "Silicon dioxide sacrificial layer etching in surface micromachining", J. Micromech. Microeng. 7, 1997, pp. R1-R13.

Salager, "Interfacial phenomena in dispersed systems", FIRP Booklet #E120-N, 1994, pp. 1-26.

Gruner, "Carbon nanotube transistors for biosensing applications", Anal Bioanal Chem, 2006, pp. 322-335.

Johnson et al., "DNA-decorated carbon nanotubes for chemical sensing", Institute of Physics Publishing, Semicond. Sci, Technol 21, 2006, pp. S17-S21.

Alves et al., Fabrication of sharp silicon tips employing anisotropic wet etching and reactive ion etching, Microelectronics Journal 36, 2005, pp. 51-54.

Wang et al., "Microfabrication and application of high-aspect-ratio silicon tips", J. Vac. Sci. Technol. B 23(4), Jul./Aug. 2005, pp. 1582-1584.

Kordas et al., Inkjet printing of electrically conductive patterns of carbon nanotubes, Small 2006, No. 8-9, pp. 1021-1025.

Wang et al., Oleic acid as the capping agent in the synthesis of noble metal nanoparticles in imidazolium-based ionic liquids, Royal Society of Chemistry, 2006, pp. 2545-2547.

Martinez et al., "Nanoscale deposition of single-molecule magnets ontoSiO2 patterns", Adv. Mater, 2007, 19, pp. 291-295.

* cited by examiner

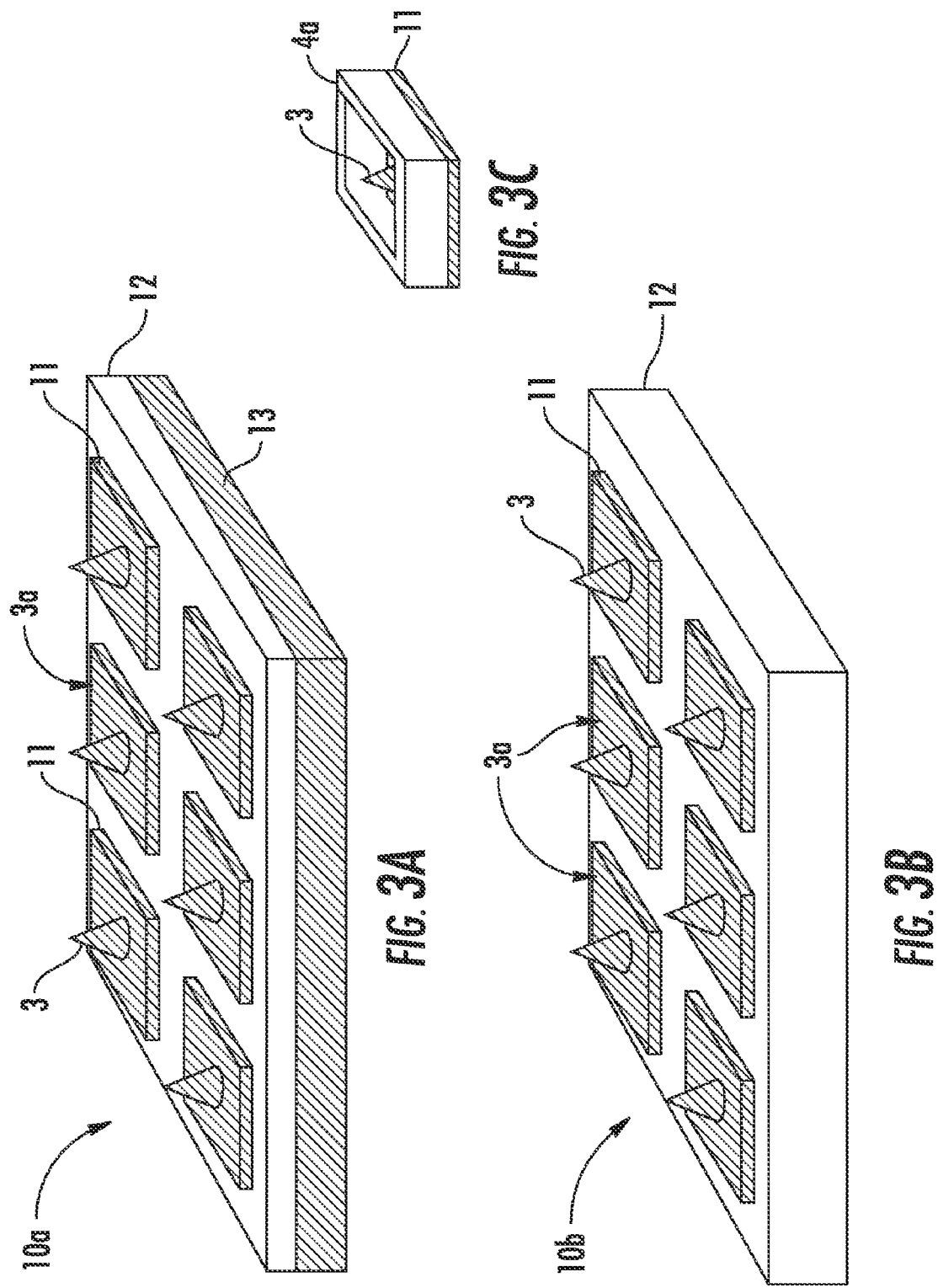

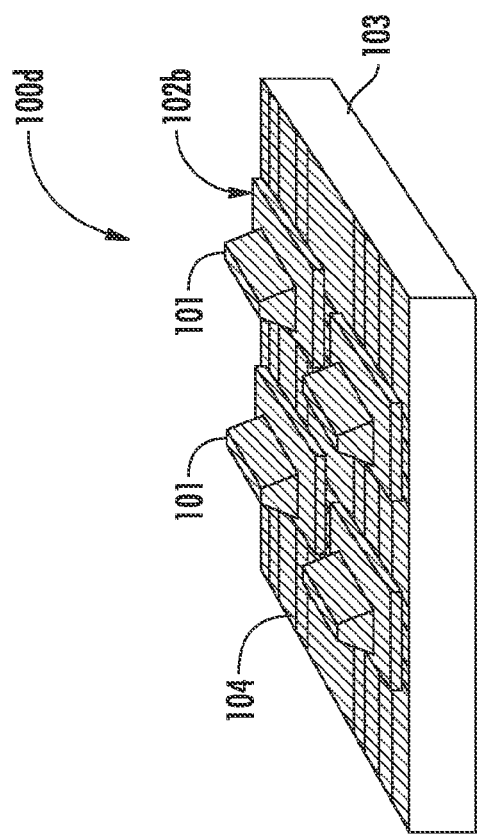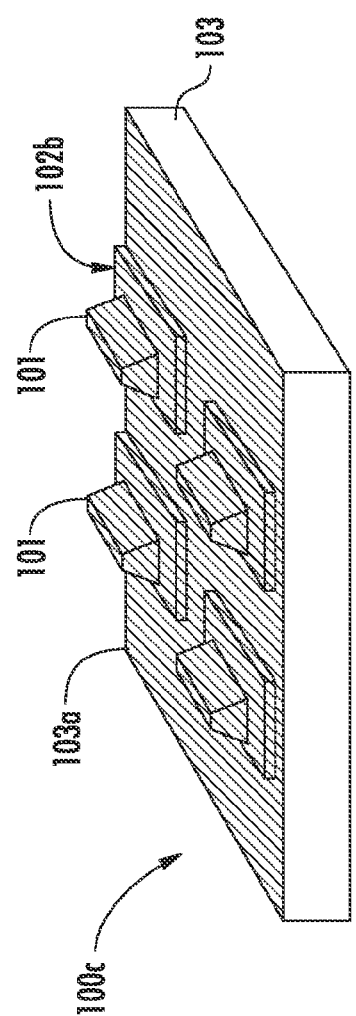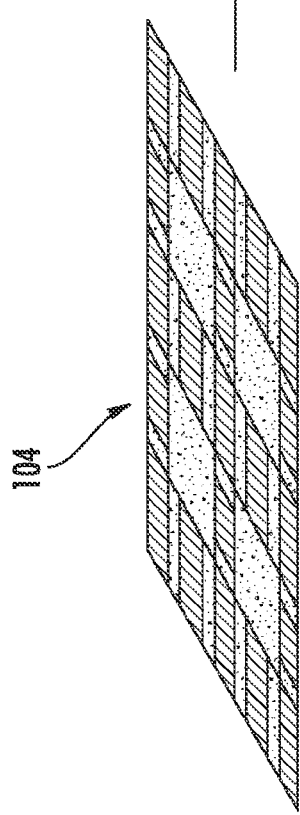
FIG. 5A
FIG. 5B

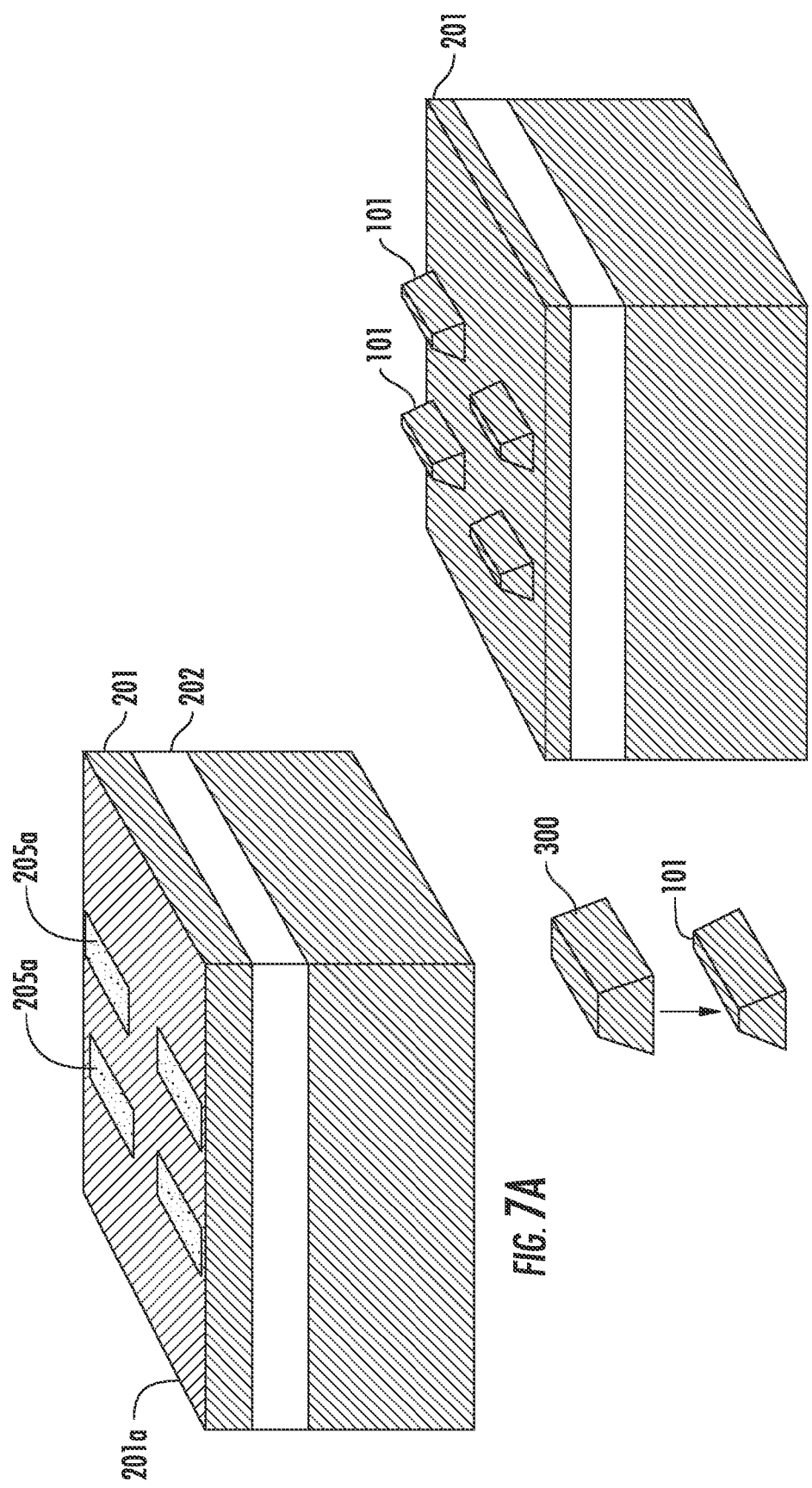

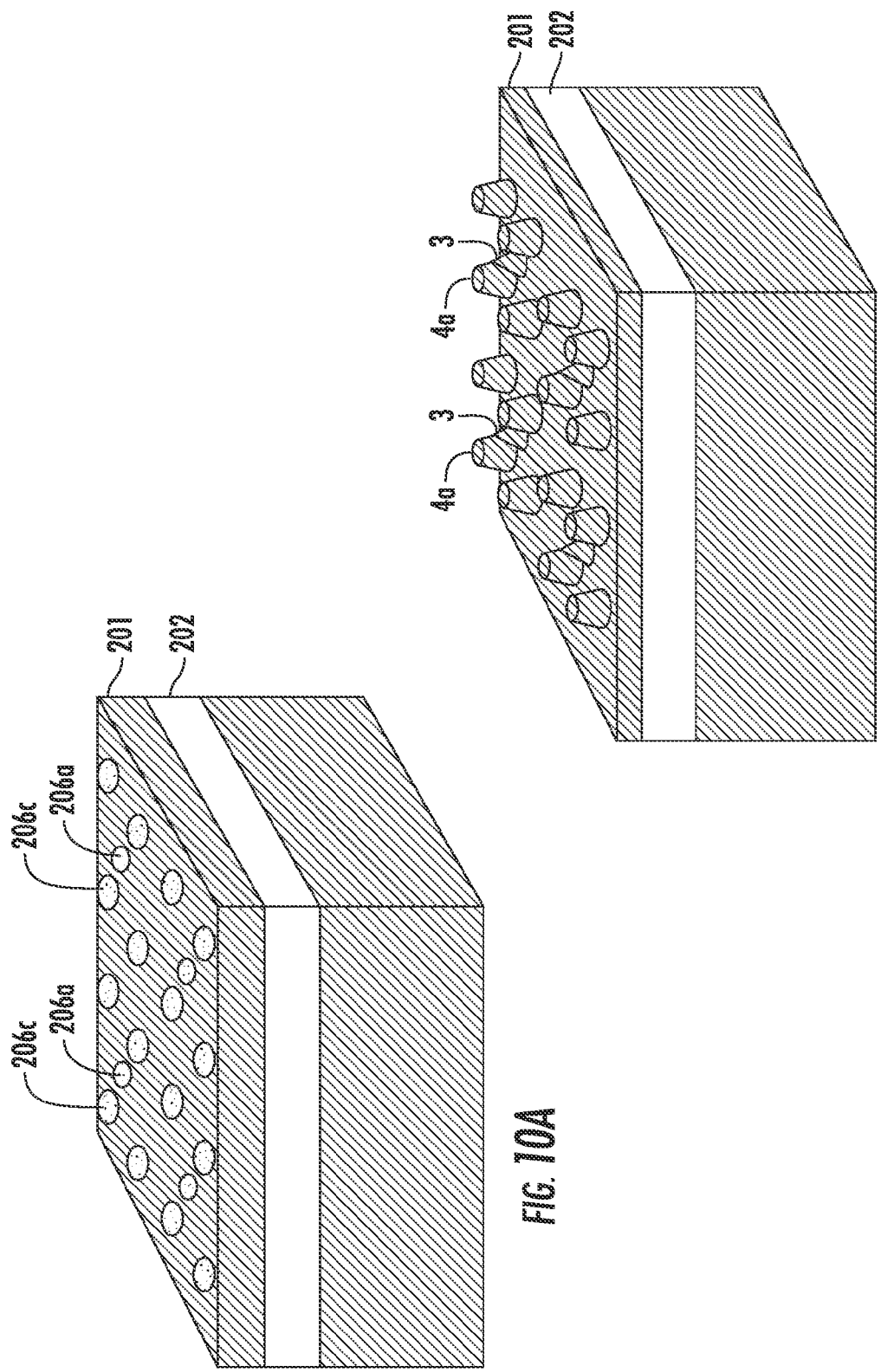

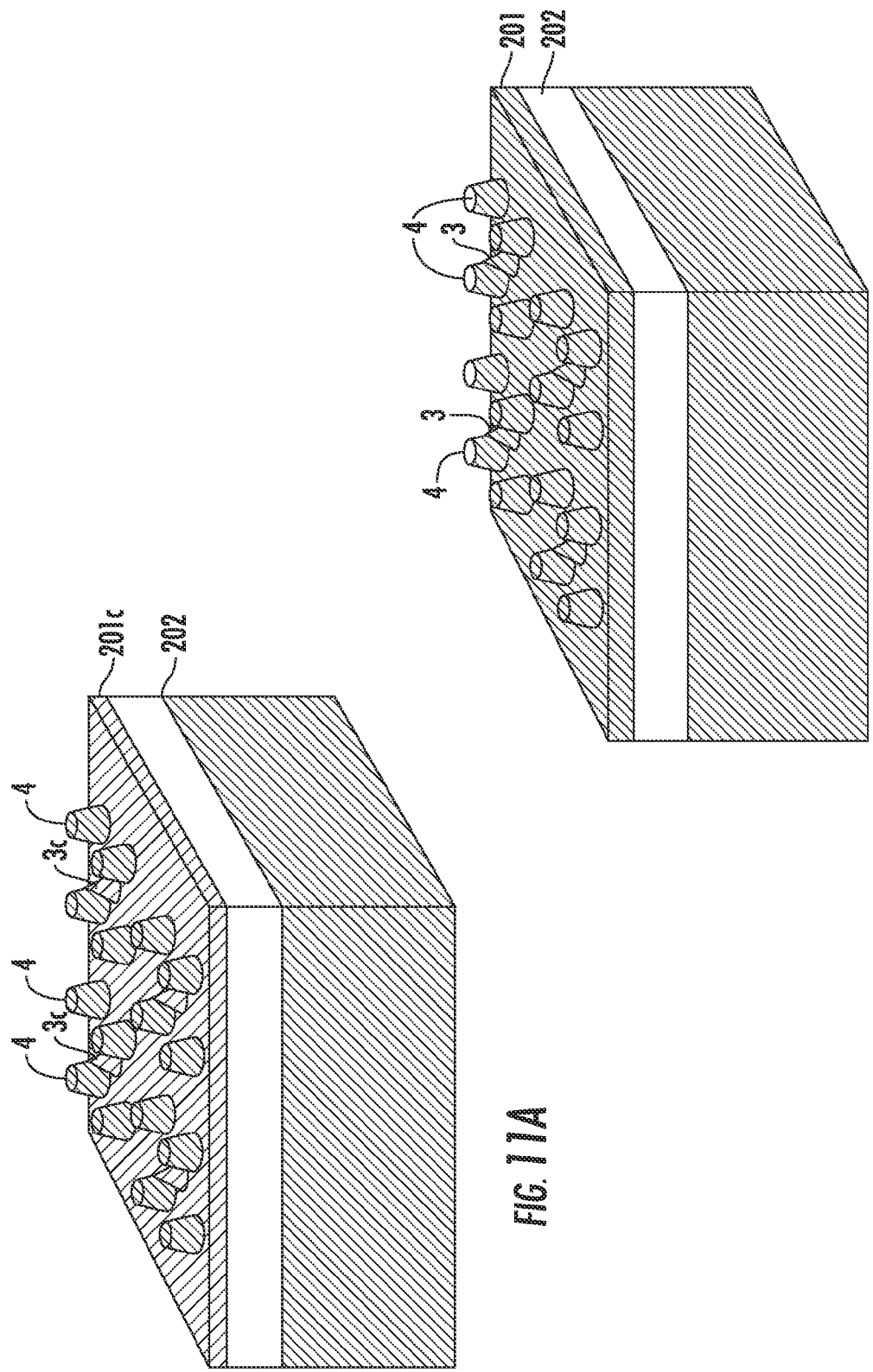

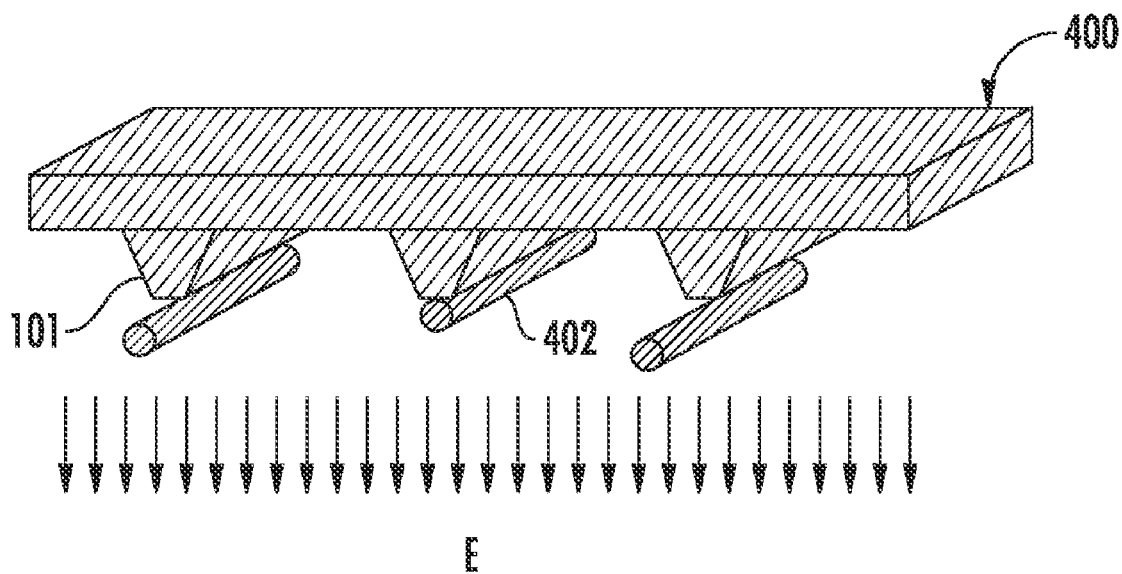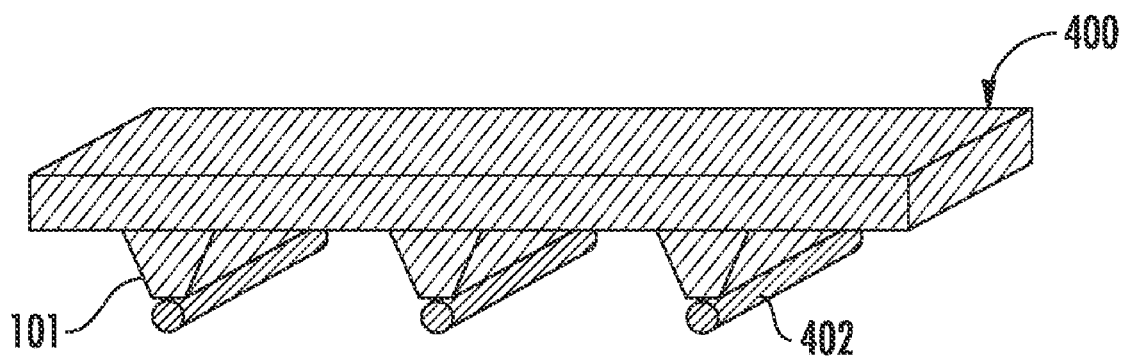
FIG. 16

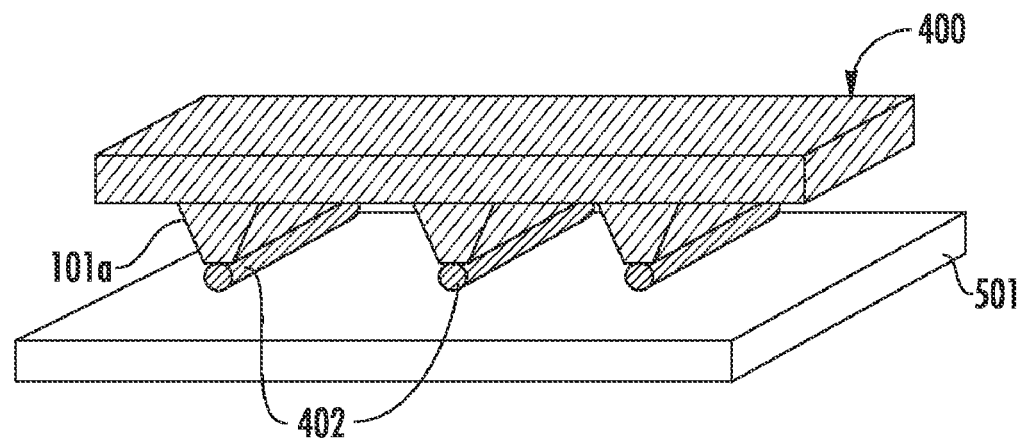
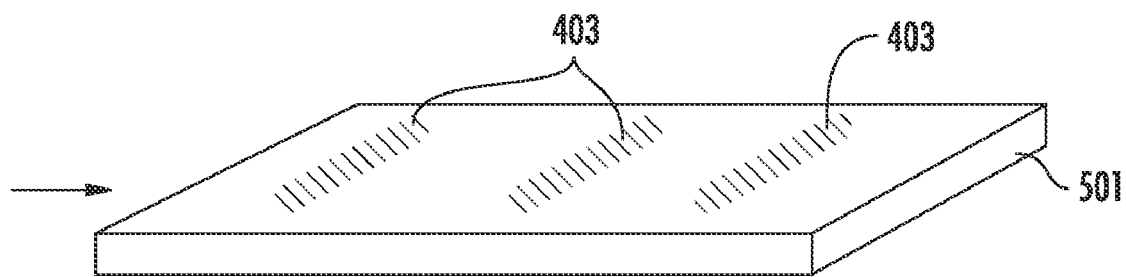
FIG. 18

MOLD HAVING NANOMETRIC FEATURES, METHOD FOR REALIZING SUCH A MOLD AND CORRESPONDING USE OF IT IN A METHOD FOR REALIZING AN ARRAY OF CARBON NANOTUBES

FIELD OF THE INVENTION

The present invention, in its most general aspect, refers to the electronics sector, and in particular to nanoelectronics and nanomanufacturing. More in particular, the invention refers to molds having nanometric features, to their realization, and corresponding use in methods for realizing arrays of carbon nanotubes.

BACKGROUND OF THE INVENTION

Carbon nanotubes are the object of a considerable and constantly growing interest in the nanoelectronics sector, which still today is not yet capable of fully exploiting its exceptional features and properties, in particular in field emission devices.

Single wall carbon nanotubes and multiple wall nanotubes show an excellent electrical conductivity at room temperature.

Carbon nanotubes are different from the metal emitters in that, in the latter, the electrical resistance increases with increasing temperature, the heat increasing proportionally with the increase in the extracted current. This causes an unstable heat dispersion, which inevitably leads to the destruction of the emission source in the metal type emitters. On the other hand, however, nanotubes are very stable emitters even at very high temperatures, due to the fact that their electrical resistance decreases with temperature, thus limiting the generated heat.

In addition, other features such as the exceptionally reduced size, the ballistic conduction, the high transport mobility, and the absence of electronic migration make the carbon nanotubes ideal candidates for transistor type applications and for the interconnections in electronic devices.

Even though recently, realization and use techniques have been developed for carbon nanotubes of a certain interest, these new materials are still far from being industrially utilized, mainly due to the difficulties encountered in managing them, which may make their positioning control particularly problematic. In order to properly exploit carbon nanotube features, it is helpful to effectively control their relative position on a substrate.

The prior art, for example, provides a horizontal positioning method of nanotubes based on the nanomanipulation, which includes using an AFM rod for moving single nanotubes onto a substrate. Other gripping devices have been made that are capable of ensuring a precise control of the horizontal positioning of nanotubes, which nevertheless allow the grip from one site and the release in a final position of a single nanotube at a time.

It is understood that techniques of this type may be limited to the realization of prototypes of devices comprising horizontally-arranged nanotube arrays, since they are serial techniques which may not easily be applied on an industrial scale.

Other techniques provided in the prior art, such as ink jet printing, dielectrophoresis, and stamp printing, permit the deposition in parallel of nanotubes on a substrate, and at competitive costs.

For example, by means of the ink jet technique, a dispersion of nanotubes can be printed following preset patterns, or it can be deposited between two electrodes, with orientation and fixing of nanotubes, by means of dielectrophoresis. Moreover, nanotubes deposited on a first substrate can be taken by means of a mold of the so-called soft type and deposited by means of contact printing on a second substrate according to the pattern in relief on the mold.

The main drawback of such techniques lies in the fact that they are applicable for the realization of nanotube networks. Furthermore, the known art provides for processes in which the nanotubes are not arranged and/or handled on a substrate but directly grown, that is realized, on them.

In the process of horizontal growth of nanotubes, a silicon substrate is engraved creating grooves or trenches in which the growth of nanotubes occurs between an edge and another of the grooves or trenches. However, such processes may not guarantee a well controlled final position of the nanotubes.

On the contrary, by engraving a catalyst layer deposited on the substrate, also in this case realizing grooves or trenches, in which nanotubes are formed, better results are attained in terms of controlling the position of the nanotubes on the substrate. However, such better results may be diminished by the fact that the diameter of a nanotube depends of the width of the groove in which it grows, which in turn depends on the resolution of the patterning technique used to create the groove. The obtainment of particularly small diameters, thus nanotubes with a high potential, necessarily implies the use of extremely costly lithography techniques which, furthermore, do not guarantee a nanotube diameter smaller than a given limit (about 20 nm).

Also in order to obtain an array of nanotubes arranged vertically on a substrate, the prior art provides processes in which the nanotubes are grown directly on the substrate. In particular, nanotubes are grown on a substrate through a technique known as CVD (chemical vapour deposition). The growth process occurs by means of aggregation of carbon atoms, supplied by a high temperature hydrocarbon gas in a nanotube crystalline structure generated by a nanometric size metal particle which serves as a catalyser and crystallisation nucleus. For example, methane gas at 900° C. and at a pressure of 750 torr can be used as a source of carbon.

Though there are several procedures for obtaining catalyst nanoparticles (distributed on a substrate) on which carbon nanotubes can be grown, an effective control of the position of each nanotube is currently attained by using e-beam lithography techniques which allow localising, on the substrate, spots or dots at desired positions.

In such a manner, it is possible to obtain vertically oriented parallel nanotubes having highly controlled positions, but the entire realization procedure may be particularly slow and very costly due to the use of the e-beam lithography and, therefore, may not be acceptable in a large scale industrialisation like the one used currently for electronic production.

Additionally, there still remains however a limit to the smallest dimension of the abovementioned catalyst spots which can be obtained through e-beam lithography.

Therefore, the need to realize (on a substrate) an array of nanotubes of particularly small dimensions with a high control of their positioning, both in case of horizontal orientation and in case of vertical orientation, at a cost allowing its industrialization in the manufacture of electronic devices, has yet to be met.

SUMMARY OF THE INVENTION

The present disclosure provides methods for realizing, on a preset substrate, an array of carbon nanotubes with a high control of their position. The term "to realize an array" means that an array comprising a preset number of carbon nanotubes is directly obtained as such, that is through a parallel approach in which the preset number of nanotubes may be directly and globally obtained on the substrate, thus not using a serial repetition for each single nanotube.

The term "array of nanotubes" means a plurality of nanotubes arranged on a substrate at controlled positions, and having a horizontal orientation or having a vertical orientation.

Therefore, according to a first aspect, this disclosure provides a mold, and a related method of realization, for directly obtaining, on a substrate, an array of carbon nanotubes, in which the mold has a preset pattern in relief coinciding with the pattern of the array of nanotubes to be obtained.

According to a second aspect, the present disclosure provides a method in which the mold is used for realizing an array of carbon nanotubes. According to the disclosure, attained are arrays of carbon nanotubes in which the nanotubes are in highly controlled positions on a substrate, defined by the pattern of the mold used, both in case of an array with horizontally arranged nanotubes, and in case of an array with vertically arranged nanotubes, as better observed hereinafter.

Further characteristics and advantages shall be clear from the description, provided hereinafter, of some of its embodiments provided for indicative and non-limiting purposes with reference to the attached designs.

BRIEF DESCRIPTION OF THE DRAWINGS

FIGS. 1-3 schematically show a mold for obtaining, on a substrate, an array of vertically arranged carbon nanotubes according to the present invention;

FIGS. 4 and 5 schematically show a mold for obtaining, on a substrate, an array of carbon nanotubes arranged horizontally according to the invention;

FIGS. 6-8 schematically show steps of a method according to the invention for realizing the molds of FIGS. 4 and 5;

FIGS. 8a-13 schematically show steps of a method according to the invention for realizing the molds of FIGS. 1-3;

FIGS. 14-17 schematically show steps of a method according to the invention for obtaining, on a substrate, an array of horizontally arranged nanotubes;

FIG. 18 schematically shows another embodiment of the method illustrated in FIGS. 14-17;

DETAILED DESCRIPTION OF THE PREFERRED EMBODIMENTS

It should be observed that the abovementioned figures are not in scale but made in such a manner to highlight the characteristics of the invention which advantageously allow the obtainment, on a substrate, of an array of carbon nanotubes in highly controlled positions, with the nanotubes themselves arranged horizontally or vertically, as better observed hereinafter.

Figure 1:
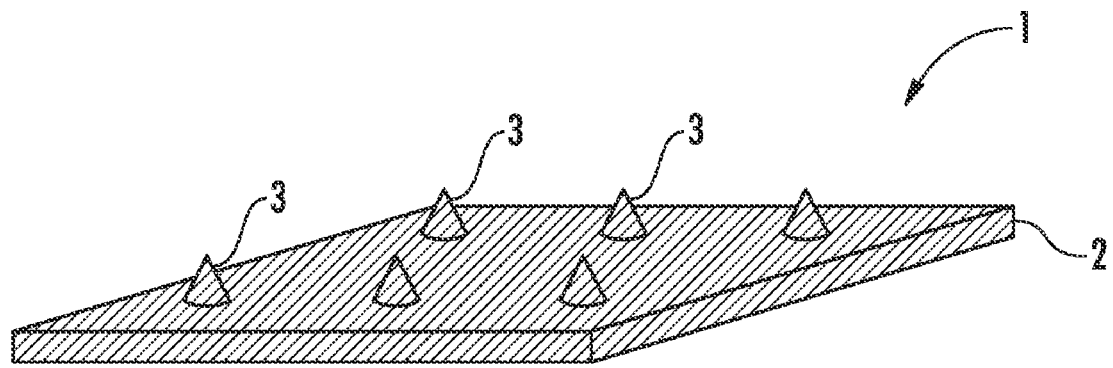

In detail, referring to FIG. 1, 1 generally represents a mold according to a first embodiment. The mold 1 comprises a first layer 2 made of a first preset material whose upper surface has, in relief, a first plurality of structures or projections 3 (first projections), which have a free end portion with a substantially pointed profile having a curvature radius comprised between 5 nm and 100 nm, preferably comprised between 5 nm and 20 nm.

The mold 1 allows obtaining, on a substrate, an array of nanotubes parallel to each other arranged vertically with a high control of their positioning, and purposely, the abovementioned projections 3 form actual points or rods having a shape which can be schematically represented as a cone.

The height of the first projections 3 is comprised between 100 nm and 10 microns, preferably between 300 nm and 1 micron. The mold, whose method of realization and the relative use shall be outlined in detail in the description hereinafter, can be advantageously made of various material provided the abovementioned projections are conductive and connected electrically.

In particular, the abovementioned first projections 3 of the mold 1, and thus the first layer on which they are obtained, can be made of material such as silicon, a metal, a metal alloy, or of a polymer made conductive by coating, therefore the mold 1 can be of the so-called "rigid" type, or of the so-called "soft" type.

Figure 2:
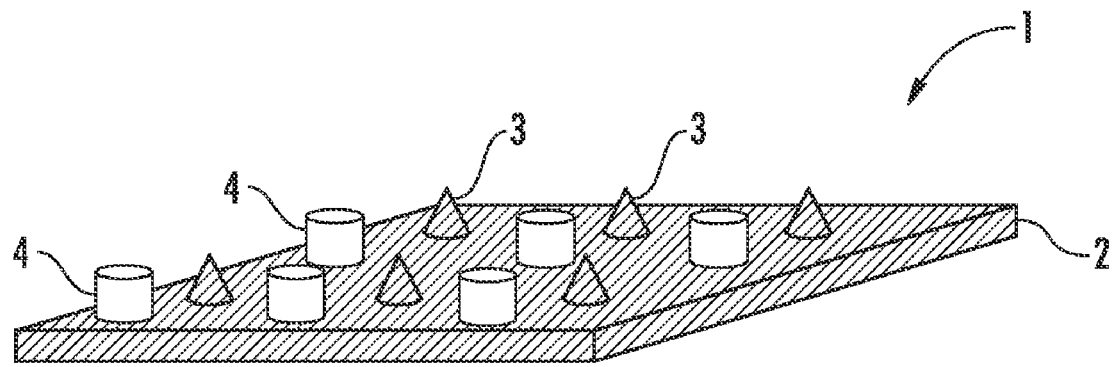

According to an embodiment of the present mold illustrated in the example of FIG. 2, a second plurality of projections 4 (second projections) can be provided on the upper surface of the first layer 2. In this case, such second projections 4 are provided with a height exceeding the one of the first projections 3, the height difference being comprised between 10 nm and 100 nm, preferably between 15 nm and 30 nm.

The second projections 4 form spacers which, in the use of the mold, help the maintenance of a preset limited distance between a substrate (not shown in the abovementioned figures) and the first projections 3, as better observed hereinafter. Therefore, contrary to the first projections 3, the abovementioned second projections 4 may not require an end portion with a particularly pointed profile and their ends can have a width, for example, comprised between 10 and 200 nm.

The second projections 4, contrary to the first projections 3, may not even require being conductive and, in fact may be insulating. The second projections 4 can have a shape schematically represented as a cylinder, frustoconical or parallelepiped-shaped and they are arranged on the first layer 2 preferably alternating to the first projections 3, as illustrated in the example of FIG. 2 showing second substantially cylindrical-shaped projections. Each second projection can also be provided in the form of a ring 4a, or any other form also capable of surrounding a relative first projection 3, as shown in The example c) of FIG. 3.

According to an alternative and particularly advantageous embodiment, the mold for obtaining, on a substrate, an array of nanotubes arranged vertically also comprises a second layer arranged beneath and coupled to the abovementioned first layer. In particular, schematically represented in FIG. 3 is a mold 10a, 10b comprising a first discontinuous layer 11 of a first preset material on which the abovementioned first projections 3 are provided, and a second layer 12 of a second preset material coupled to the first layer 11 on a surface opposite the one having the projections 3.

In such case, the first layer 11 preferably comprises doped silicon, while the second layer 12 is advantageously a polymer layer. The present mold is defined as of the "combined" type, that is "rigid/soft".

The abovementioned second polymer layer 12 serves to confer the mold 10a, 10b, in particular the rigid portion of the mold when it is being used to obtain an array of carbon nanotubes, with the capacity to react elastically to possible non-uniformities at contact between the projections 3 and a substrate.

Advantageously, the second layer can comprise a large variety of polymer materials given that polymers can have an elastic behaviour, especially when it comes to small deformations.

The thermosetting polymers with elastomeric properties having a high deformation capacity under stress, and a high capacity to recover from the deformation upon the end of the stress, are preferred. Polymers of this type comprise polymer chains linked to each other by means of chemical bonds, which allow recovering from an externally induced deformation.

Examples of such polymers are NBR (butadiene-Acrylonitrile, EP (ethylene-propylene) and SBR (styrene-butadiene). Regarding the thickness of the second polymer layer 12, it should be added that it is determined by the function that the second layer itself may have, which might be limited to conferring to the present mold the abovementioned elastic properties (mold 10*a*, FIG. 3-*a*), or additionally, an actual function of supporting the first layer on which the projections 3 are arranged (mold 10*b*, FIG. 3-*b*).

In case the second polymer layer 12 forms an actual support for the first layer 11, its thickness is generally greater than 10 microns, preferably comprised between 50 microns and 1 mm. In case the second polymer layer 12 does not form an actual support for the first layer 11, the present mold advantageously also comprises a third layer 13 arranged beneath the second layer 12.

The presence of the third layer 13 of substantially rigid material that serves as a support for the second layer and in practice for the entire mold, allows reducing the dimensions of the second layer 12 to a thickness greater than 30 nm, preferably comprised between 100 nm and 10 microns.

Regarding the first layer it should be noted that it can be a continuous layer, for example a doped silicon layer of small thickness, or the first layer 11 can be a discontinuous layer, right as shown in the example of FIG. 3-*a*)-3-*b*), in which each projection 3 is located on a respective portion of the first layer or pad 3*a*. In case of a first discontinuous layer 11 the abovementioned pads 3*a* are electrically connected to each other and they are at a distance in comprised between 500 nm and 1 mm, preferably comprised between 1 micron and 100 microns.

The electrical connection of the pads 3*a* can be realized in various ways, for example, the mold 10*a*, 10*b* can comprise a metal film between the first layer 11 and the second layer 12, or a metal mask reproducing the pattern of the mold can be arranged on the upper surface of the mold, the abovementioned electrical connections not being represented in the abovementioned figures. It should be added that the mold 10*a*, 10*b*, that is, the rigid/soft type of mold can comprise a second plurality of insulating projections (second projections) and whose height is greater than the first projections 3, analogously to the description outlined previously for the mold 1 and as shown in the detail of the example of FIG. 3-*c*).

Figure 4A:
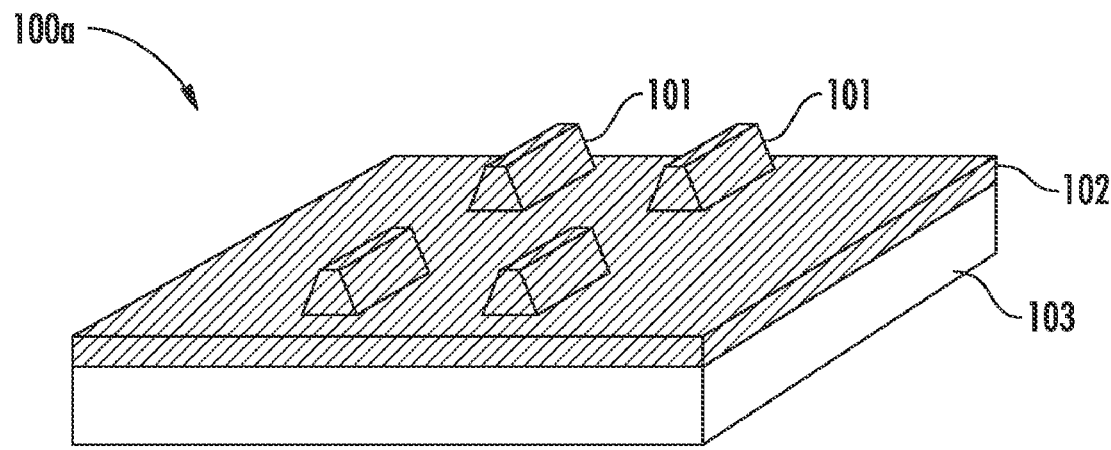
Figure 4B:
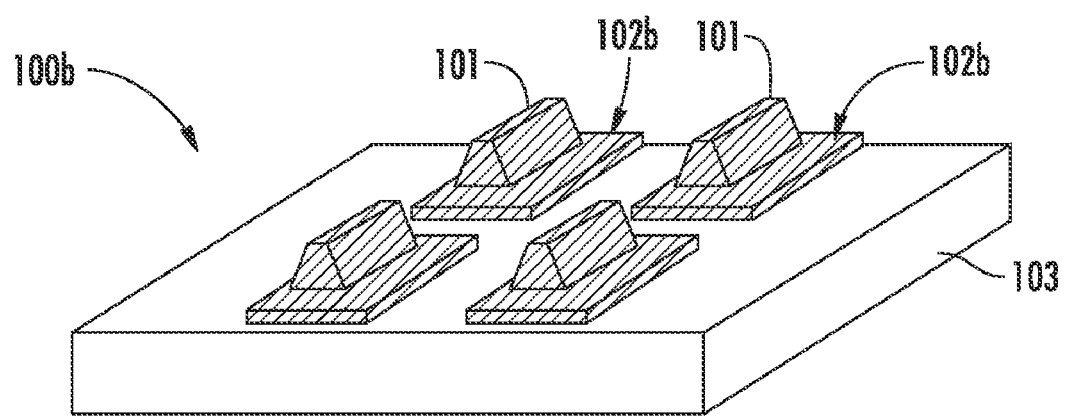

In order to obtain, on a substrate, an array of horizontally arranged carbon nanotubes, with a high control of their positioning, the present embodiment provides a mold 100*a*, 100*b*, schematically illustrated in the example of FIG. 4-*a*)-4-*b*) comprising a first layer on which the first projections 101 are characterized in that they also have a preset length comprised between 10 nm and 10 microns, preferably between 10 nm to 100 nm.

In particular, the mold 100*a*, 100*b*, comprises first projections 101 having an end portion with a substantially pointed profile, which can be schematically represented in the form of a polyhedron with a trapezoidal cross-section, whose smaller base (free end) has a width substantially smaller than the width of the greater base, comprised between 5 nm and 100 nm and preferably comprised between 5 nm and 20 nm, that is, comparable with the one of the first projections 3 realized in the form of rods, and a length as considered above.

The mold considered in this case is similar to the examples of the molds described above regarding the possibility to be of the rigid type, or of the soft type, or of the combined rigid/soft type, with or without the third layer, and with the first layer being continuous or forming pads; therefore regarding such characteristics, see the description above, here below being only briefly described the non-limiting example of FIG. 4, wherein the mold 100*a* comprises a first continuous layer 102 realized on which is a plurality of first projections 101, and a second polymer layer 103.

It should be advantageously noted that in this case the abovementioned continuous first layer 102 is particularly thin, that is, with a limited preset thickness in such a manner that it is also provided with a given flexibility, in such a manner that the entire mold 100*a* has the capacity, also due to the underlying second polymer layer 103, to react elastically against possible contact non-uniformities, as argued beforehand.

The mold 100*b* comprises a first discontinuous layer, that is, it has a plurality of pads 102*b* each of which has a respective first projection 101, and a second layer 103 positioned at the lower side and coupled to the first layer in form of pads.

In any case, in the mold 100*a*, 100*b* independent of the type, that is, regardless of whether dealing with a rigid, soft or rigid/soft mold like the one shown in FIG. 4, the abovementioned first projections 101 can be suitably functionalized whenever desired.

Furthermore, contrary to the example of the mold described above with reference to an array of vertical nanotubes, the abovementioned first projections 101 of the mold 100*a*, 100*b* depending on the case can or cannot be conductive and connected electrically, given that such mold can be used to attain an array of horizontally arranged nanotubes according to an alternative embodiment of the method according to the invention, as better observed hereinafter.

Therefore, also regarding the abovementioned characteristic of the electrical conduction see the preceding description, only briefly described in the following for non-limiting purposes through the examples of FIG. 5 are a mold 100*c* comprising a plurality of first projections 101 arranged on a first discontinuous layer in form of pads 102*b*, and a second polymer layer 103 having a metal coated surface 103*a* on which the pads 102*b* are arranged; and a mold 100*d* comprising a plurality of first projections 101 arranged on a first discontinuous layer in form of pads 102*b*, a second polymer layer 103 arranged below and coupled to the first layer, and a metal mask 104 having a geometric pattern reproducing the one of the upper surface of the mold.

The present mold, in particular in the so-called rigid and rigid/soft molds embodiments described above, is obtained through a method comprising providing a substrate of a preset material having an upper surface and thermally growing, on such upper surface, a first layer of thermal oxide. The method further includes depositing, on the first layer of thermal oxide, a layer of photosensitive material, for example resist and realizing, on the layer of photosensitive resist, a preset pattern through optical lithography or e-beam lithography patterning. Additionally, the method includes developing the resist layer and etching the first thermal oxide layer to obtain a thermal oxide mask with geometry corresponding to the abovementioned preset pattern and selectively etching the upper surface of the substrate to obtain on it, beneath the abovementioned mask, a first plurality of projections having substantially sloping side walls.

The plurality of projections having substantially sloping side walls are filed by means of plasma etching. Moreover, the method includes thermally growing, on the upper surface of the substrate, a second oxide layer, thus further filing the first plurality of projections having substantially sloping side walls and selectively removing the second thermal oxide layer and the abovementioned mask to free the upper surface of the substrate, and to obtain a first plurality of projections thereon having an end with a substantially pointed profile.

As argued above the present mold can have conductive and electrically connected or non-connected first projections, substantially shaped as rods or also provided with a given length. A first approach to obtain the electrical conduction characteristic includes using a substrate whose abovementioned upper surface is conductive and continuous as previously described. Furthermore, if the abovementioned substrate is of the rigid type, for example silicon, it can be coupled to a polymer layer to realize a mold of the rigid/soft type.

It should be noted that a rigid/soft mold with a first rigid and continuous layer may provide for a relative small thickness of the first layer in such a manner to have the abovementioned characteristics of flexibility and elasticity as argued beforehand.

By using, as a substrate, a SOI (silicon on insulator) wafer indicated in its entirety with 200, the abovementioned method of realization of a mold comprising first projections 101 for realizing an array of horizontally arranged nanotubes is schematically illustrated in a preferred embodiment in the examples of FIGS. 6-8a, while in FIGS. 9-13 the method is schematically illustrated in the case the realization of a mold comprising first projections 3 for realizing an array of vertically aligned nanotubes is desired, as argued beforehand.

In detail, starting from the abovementioned SOI wafer comprising an upper silicon layer 201 and a lower oxide layer 202, wherein the abovementioned upper surface of the substrate corresponds to an upper surface 201a of the upper silicon layer 201, the present method preferably further comprises selectively etching the lower oxide layer 202 with its removal and coupling, by a photosensitive glue layer, the upper silicon layer 201 comprising the first plurality of projections 101 (or comprising first projections 3) having an end with a substantially pointed profile to a layer of a preset polymer 103. The upper silicon layer 201 is optionally made discontinuous, realizing respective pads 102b (or realizing respective pads 3a) each comprising a respective projection, wherein such pads are separated by a distance comprised between 500 nm and 1 mm, preferably comprised between 1 micron and 100 microns. The abovementioned pads 102b are electrically connected to each other (or the pads 3a are electrically connected to each other) and then to the projections of the first plurality of projections through a metal mask 104 having a geometry corresponding to the abovementioned preset pattern, like the one shown in FIG. 13-b) relatively to a mold having first projections 3 in form of rods, or also as shown in the previous example of FIG. 5-b) regarding a mold having first projections 101 for obtaining horizontally arranged carbon nanotubes.

Or, still considering a SOI wafer of the abovementioned type, the present method further comprises selectively etching the lower oxide layer 202 with its removal and coupling, through a photosensitive glue layer, the upper silicon layer 201 comprising the first plurality of projections 101 (or comprising the first plurality of projections 3) having an end with a substantially pointed profile to a metal coated surface 103a of a preset polymer layer 103, as illustrated in the previous example of FIG. 5-a). The upper silicon layer 201 is made discontinuous to realize a plurality of pads 102b (or a plurality of pads 3a) each comprising a respective projection of the first plurality of projections, the pads being separated from each other by a distance comprised between 500 nm and 1 mm, preferably comprised between 1 micron and 100 microns (FIG. 8, FIG. 13-a)).

In any case, preferably, the removal of the abovementioned lower oxide layer 202 is obtained through selective acid etching, for example using HF solutions while, advantageously, the abovementioned preset polymer layer 103, metal coated or not, can be supported on a third layer, preferably a further silicon layer.

According to the present method, the abovementioned projections of the first plurality of projections (first projections) have a same height comprised between 100 nm and 10 microns, preferably comprised between 300 nm and 1 micron, and they have a pointed end portion of the same width or the same curvature radius comprised between 5 nm and 100 nm, preferably comprised between 5 and to 20 nm, depending on the geometry of the abovementioned pattern provided on the resist layer.

Figure 6:
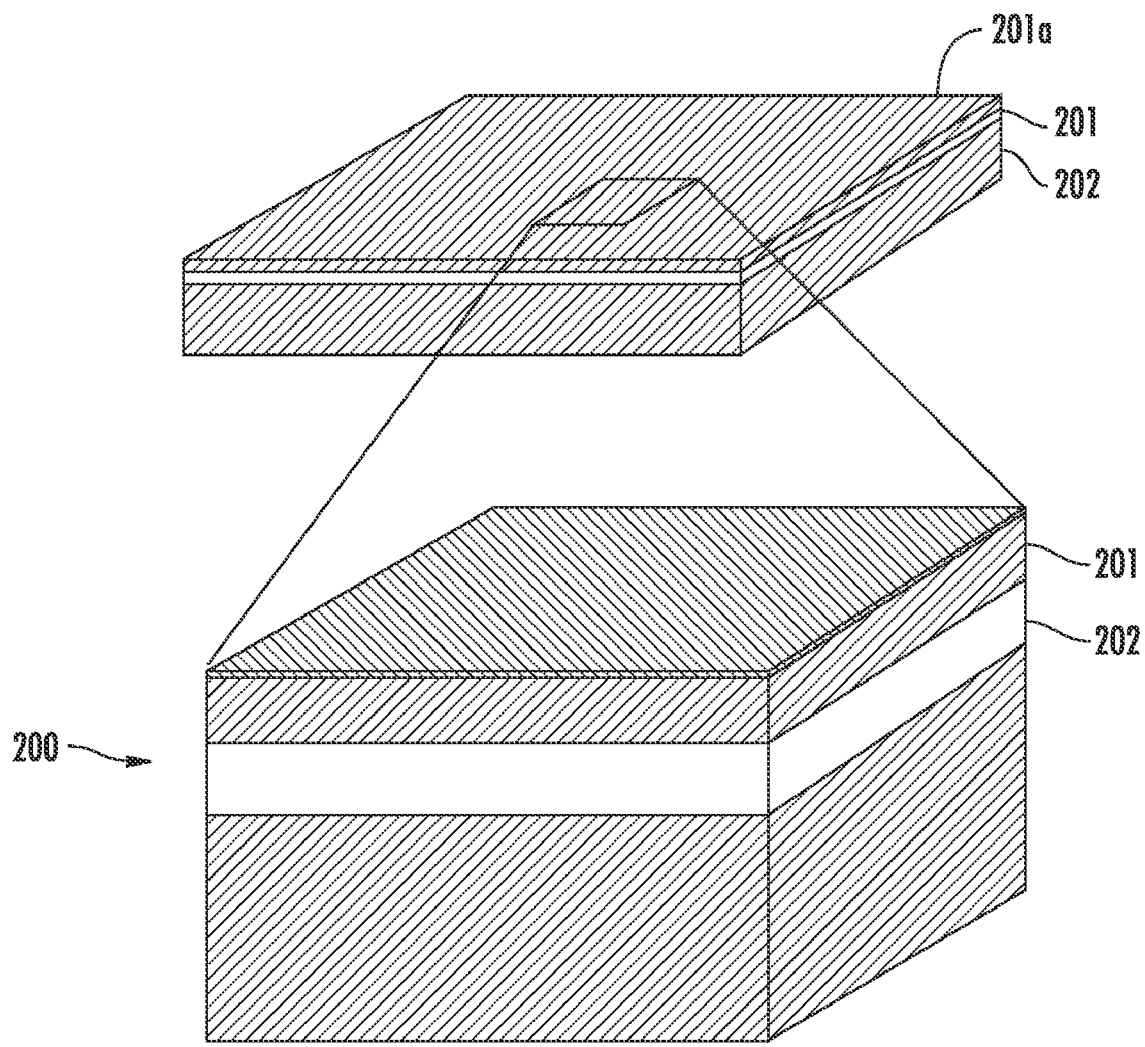
Figure 6A:
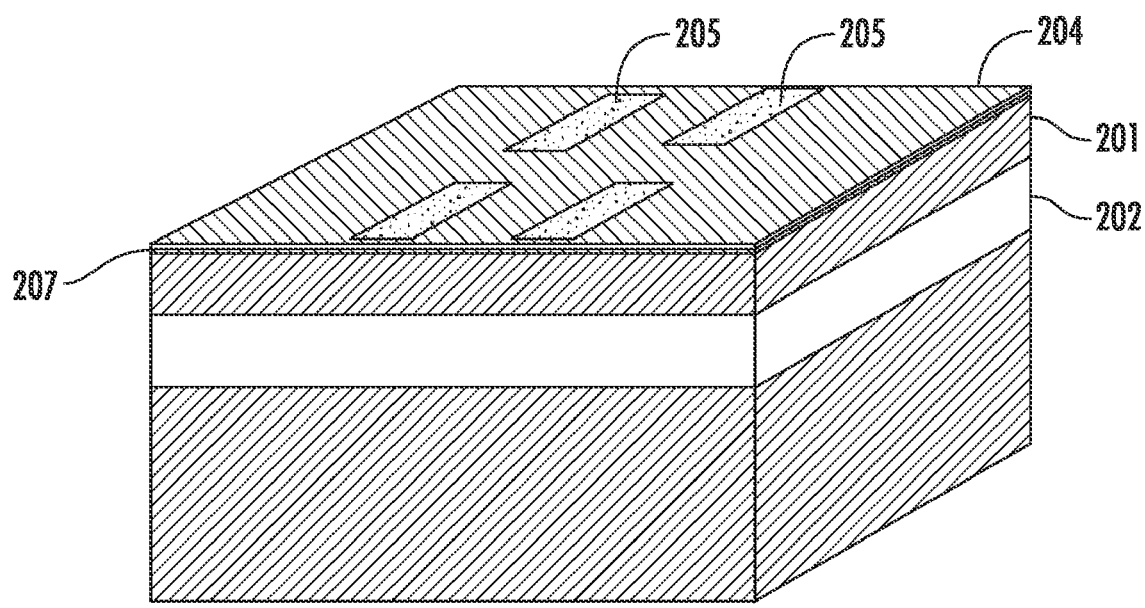

With regard to this, it should be added that the resist layer, in the abovementioned figures indicated with 204, is developed in a conventional manner to obtain the abovementioned pattern comprising, in case of a mold for obtaining an array of horizontally arranged nanotubes, a plurality of substantially rectangular windows 205 (FIG. 6a), or comprising, in the case of a mold for obtaining an array of vertically arranged nanotubes, a plurality of spots or dots, depending on the type of first projections desired to be realized in the mold.

Still in a conventional manner, then by etching the abovementioned thermal oxide layer indicated with 207, obtained through the abovementioned windows are respective rectangular oxide masks 205a, in case of a mold for obtaining an array comprising horizontally arranged nanotubes (FIG. 7-a), or oxide masks substantially forming spots or dots, in case of a mold for obtaining an array comprising vertical nanotubes, indicated with 206a in the example of FIG. 10-a.

Through a selective wet etching, by exploiting the abovementioned plurality of first projections having substantially sloping side walls 300 (FIG. 7-b), is obtained on the upper silicon layer (first layer). This latter step, along with the steps of progressive filing of the first projections forming the relative end portions with a substantially pointed profile, is schematically illustrated, with regard to a single first rod-shaped projection 3, in the example of FIG. 8a.

It should be observed that the example indicated in FIG. 8a and described hereinafter is valid even in case first projections 101 of a given length are desired. In particular, in FIG. 8a-b) is shown an upper silicon layer 201 on the upper side of which is obtained the abovementioned mask 206a in the form of an oxide spot or dot.

Figure 8:
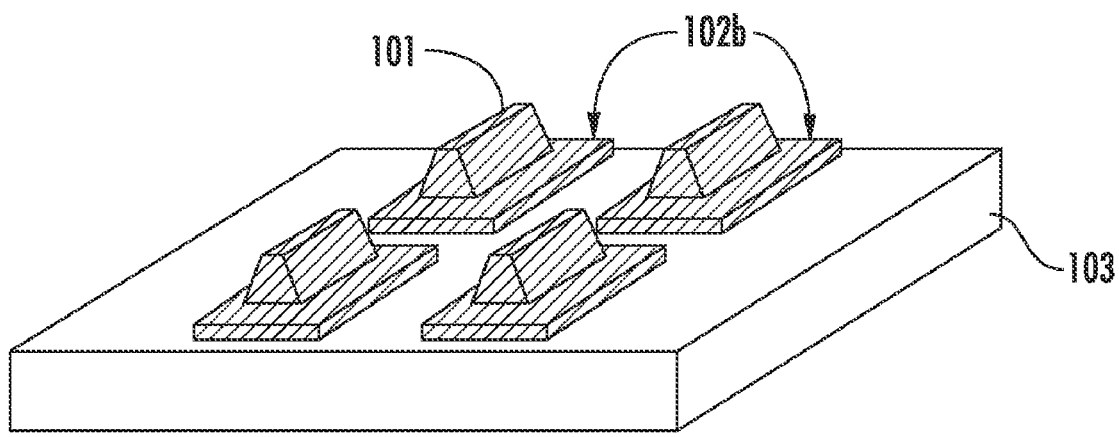
Figure 8A:
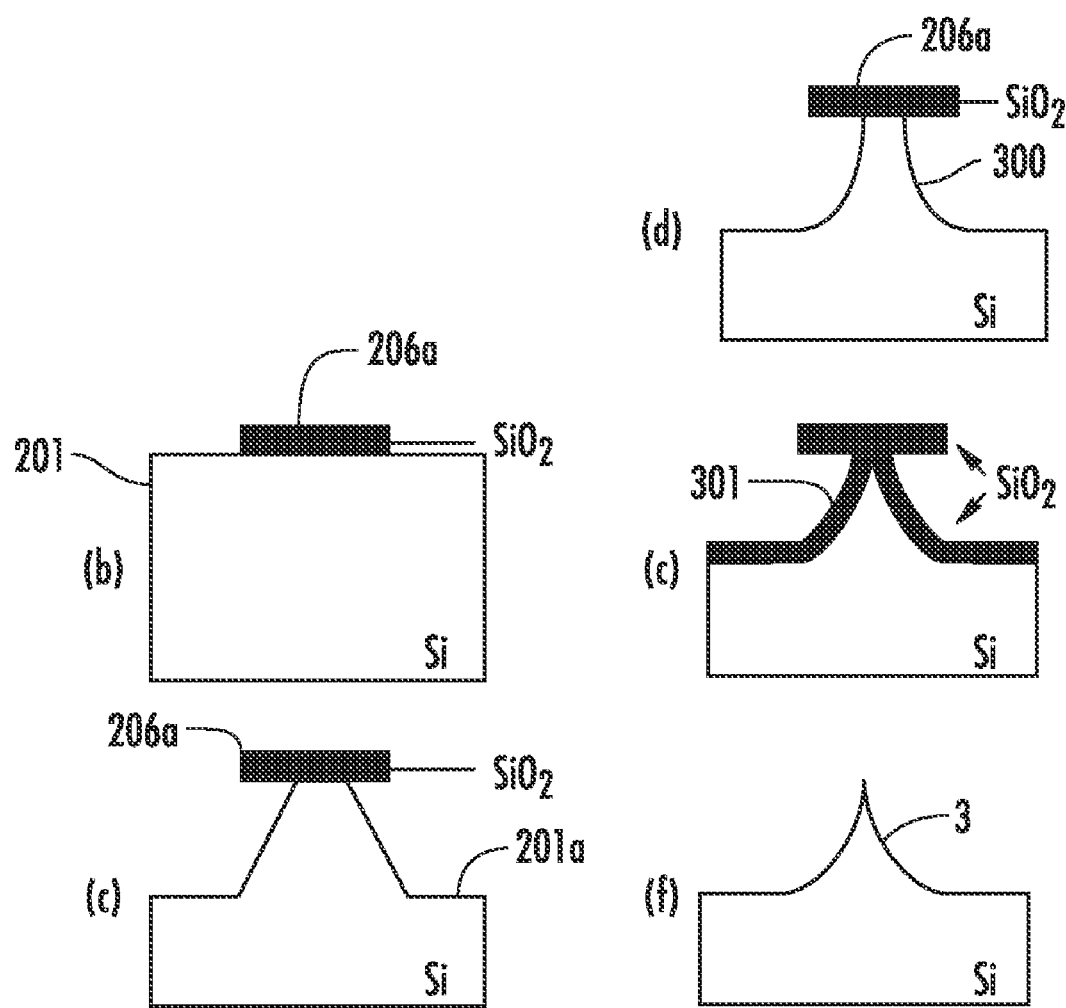
Figure 9:
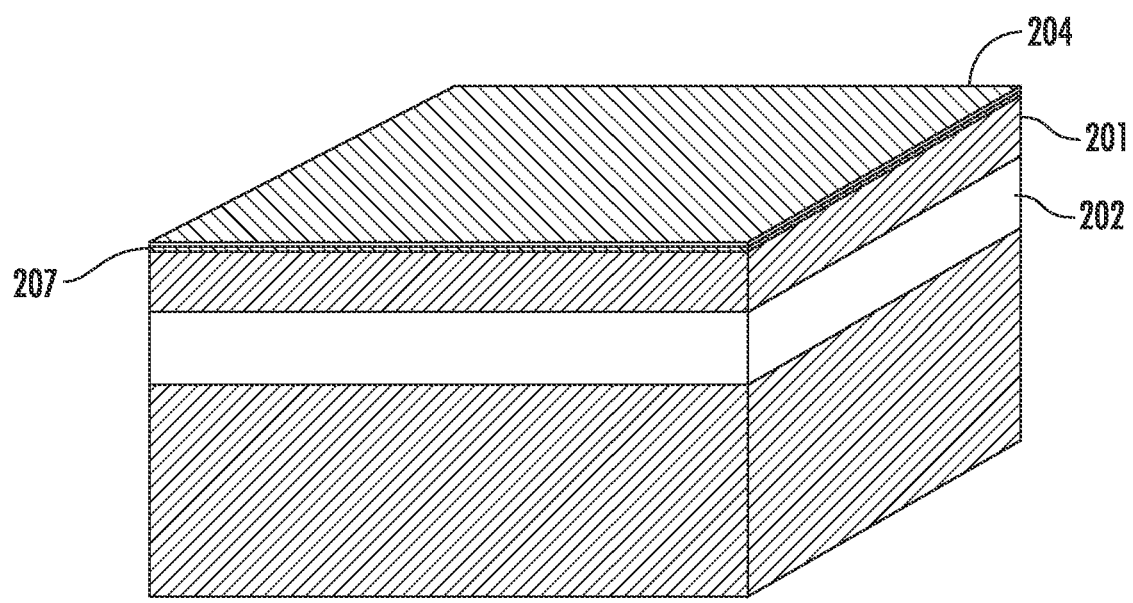

In FIG. 8a-c) is represented a first projection with substantially sloping side walls 300 as obtained following the abovementioned selective wet etching exploiting the mask 206a. Subsequently, as aforementioned, follows a plasma etching, for example an $SF_6$ etching (FIG. 8a-d)) obtained through which is a first filing of the first projection.

Then follows a thermal oxide growing step with the formation on the upper silicon layer 201 of a second oxide layer indicated with 301 which occurs on the, and at the expense of the, upper surface 201a of the first layer 201, in particular at the expense of the first projection, having the substantially sloping side walls, already filed previously for the first time. In this step (FIG. 8a-e)) a further filing of the first projection is carried out thus forming a relative end portion with substantially pointed profile, which is still covered by the second oxide layer 301.

The subsequent removal of the mask 206a and of the second oxide layer 301 frees the upper surface of the substrate (first layer) thus defined on which shall be the abovementioned first rod-shaped projection 3 (FIG. 8a-f)). Obviously, in practice, a plurality of first rod-shaped projections 3 shall be defined or, alternatively as argued previously, a plurality of substantially extended first projections.

In case of substantially extended first projections 101, the relative pointed end portion has a length comprised between 10 nm and 10 microns, preferably comprised between 10 nm and 100 nm. As previously described, in particular in case of first rod-shaped projections, the present mold may also comprise a second plurality of projections 4 (second projections or spacers) taller with respect to the first projections 3. In order to obtain such second projections the present method comprises providing on the abovementioned resist layer 204 a preset pattern comprising various geometries, that is, the first plurality of spots or dots described above for obtaining the first projections 3 and a second plurality of bigger spots or dots for obtaining the second projections 4.

Then obtained from such geometries of the pattern are the respective oxide masks, that is, oxide masks 206a as described previously and bigger oxide masks 206c, as shown in the example of FIG. 10-a). By optimizing the surface area difference between the abovementioned masks 206a and 206c (that is the sizes of the spots when patterning the resist layer 204), it is possible to vary the height difference between the second and the first projections which is comprised between 10 nm and 100 nm, preferably comprised between 15 nm and 30 nm.

The width of the second projections 4, at their end portions, is preferably comprised between 10 nm and 200 nm. Obviously, as described beforehand, it is possible to obtain variously shaped spacers through a suitable patterning of the resist layer, for example it is even possible to obtain a ring-shaped spacer; in this case a first projection shall be substantially surrounded by a relative spacer.

As previously argued, the abovementioned second projections 4 are electrically insulating contrary to the first projections which, when in the rod-shaped form, as the case now being considered, may be electrically conductive.

In order to differentiate, from the electrical conduction point of view, the first projections from the second projections, the method provides for some alternatives.

In an embodiment illustrated in the example of FIG. 10-b), the abovementioned upper silicon layer 201 is a doped silicon layer on which first and second conductive projections 3, 4a are initially obtained. The second conductive projections 4a are then made selectively insulating (indicated with 4 in FIG. 11-b)) through an oxygen implantation step followed by thermal treatment.

In this case, a selective oxidation of the second conductive projections 4a can be performed by means of an implantation mask which substantially covers the entire substrate 200 and leaves the second projections exposed to a high concentration of oxygen. Following the implantation which preferably leads to a concentration of oxygen in the second projections comprised between $10^{16}$ and $10^{18}$, a thermal treatment at a temperature comprised between 750° C. and 959° C., in a nitrogen atmosphere, generates the desired insulating oxide from oxygen thus forming the abovementioned second insulating projections 4.

According to another embodiment, the abovementioned upper silicon layer, on the contrary, can be a non-doped layer on which first and second non-conductive projections are initially obtained. The upper silicon layer is then made conductive alongside the first projections through a doping step performed by means of ion implantation.

In this case, shown in the example of FIG. 11-a), an upper initially non-doped silicon layer 201c was selectively doped and made conductive alongside first initially non-doped projections 3c, while the second projections 4 not subjected to the doping step remain substantially non-conductive.

The doping agent can advantageously be any element capable of making the silicon conductive. For example, a doping method with a phosphorous concentration comprised between $10^{14}$ and $10^{20}$ atoms/cm$^3$, preferably comprised between $10^{18}$ and $10^{20}$ atoms/cm$^3$, and a subsequent thermal treatment performed in order to make uniform the doping agent in the silicon layer can be used. The thermal treatment is performed at a temperature comprised between 300° C. and 1100° C., preferably comprised between 700° C. and 1100° C.

Still, regarding the upper silicon layer and in particular the entire SOI wafer, some further considerations should be added. In detail, the upper silicon later 201 has a thickness comprised between 1 and 100 microns, preferably comprised between 1 and 5 microns, while the lower oxide layer 202, which as described above is substantially a sacrificial layer no longer present in the mold, has a thickness comprised between 0.2 and 1.5 microns, preferably comprised between 0.5 and 1 micron.

The abovementioned third layer, preferably made of silicon, mentioned beforehand referring to the description of the present mold and indicated with 13, can be deemed substantially irrelevant to the object of the present method and may serve as a support in the same method of production of the present mold, whose thickness is comprised between 300 and 725 microns.

Alternatively, such third layer 13 can be used as an actual support layer in the mold, for example for supporting the polymer layer 103, in which case its thickness is preferably comprised between 500 and 700 microns.

Figure 12A:
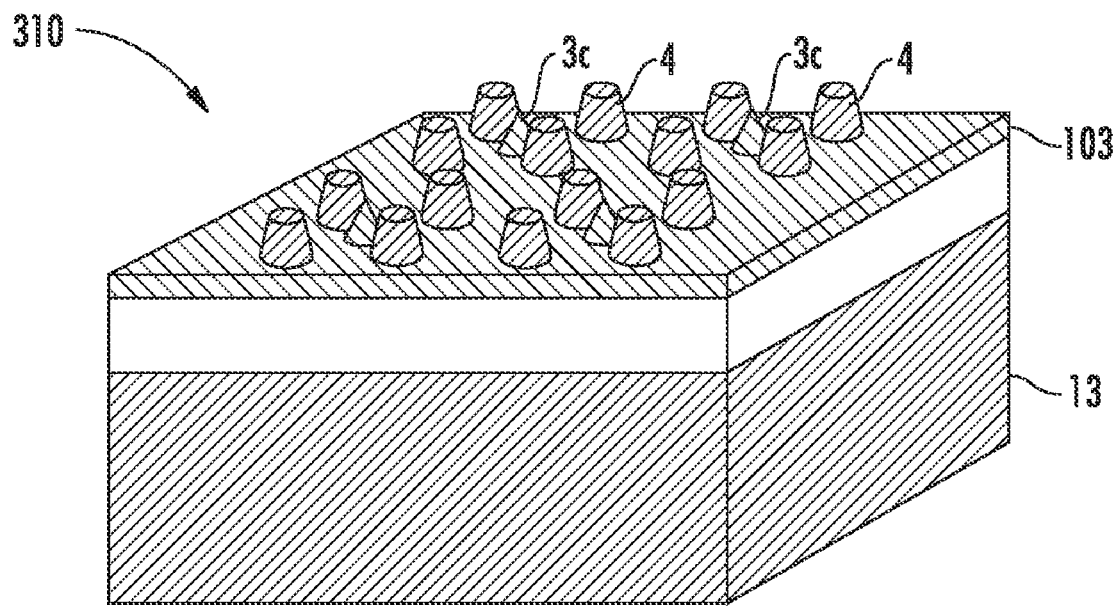
Figure 12B:
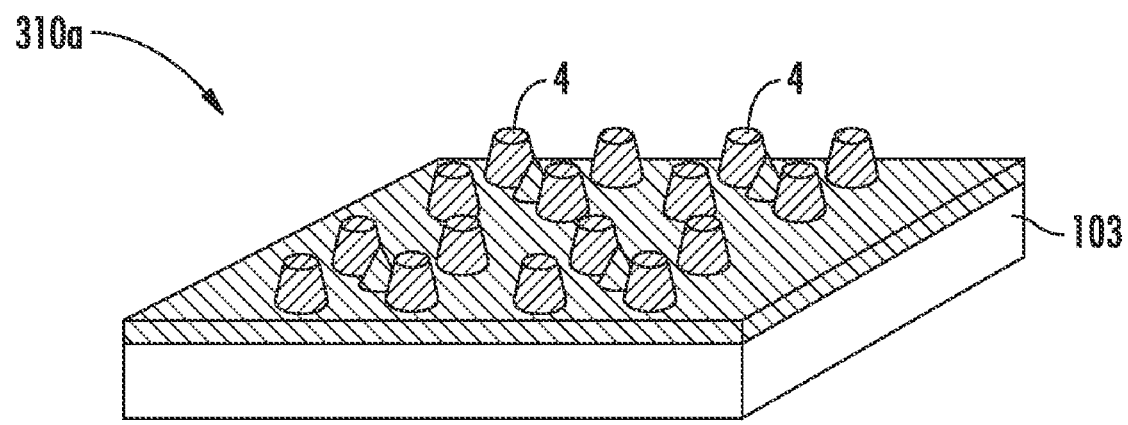

With regard to this, in the example of FIG. 12-a) a mold is shown 310 comprising an upper continuous silicon layer (first initially non-doped layer), having a small thickness such to be flexible, on which the following are arranged: first conductive projections in form of rod-shaped elements and second non-conductive projections 4 in form of spacers, a second polymer layer 103 coupled with the upper layer on a face opposite to the one bearing the abovementioned projections and a third layer 13 coupled with the underside of the second polymer layer 103.

It should be observed that the method of realization of the mold illustrated in the example of FIG. 12-a) is particularly advantageous in case of use of an SOI wafer as argued above, such SOI wafer allowing micromachining on an already thin layer (upper layer or first layer) and which is supported in such micromachining step, thus its thinning to obtain the first projections and possibly the second projections is particularly controllable and easy as well as inexpensive.

Figure 13A:
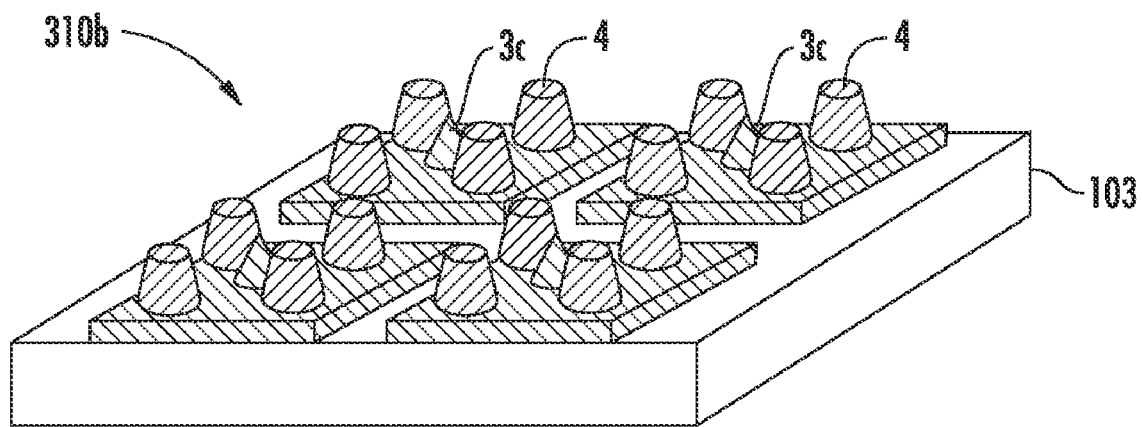
Figure 13B:
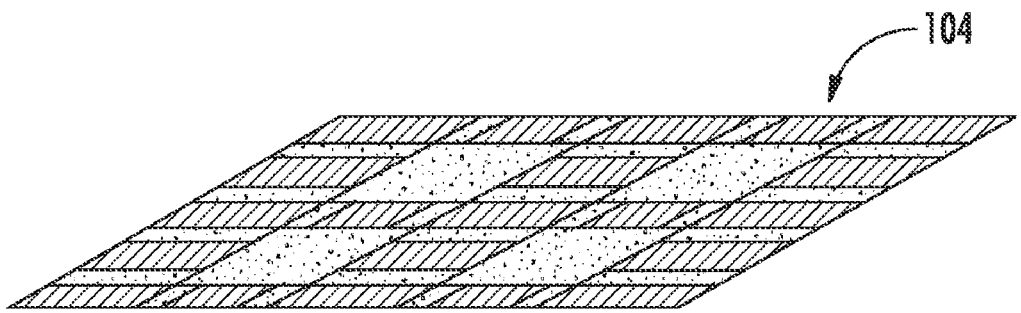
Figure 14:
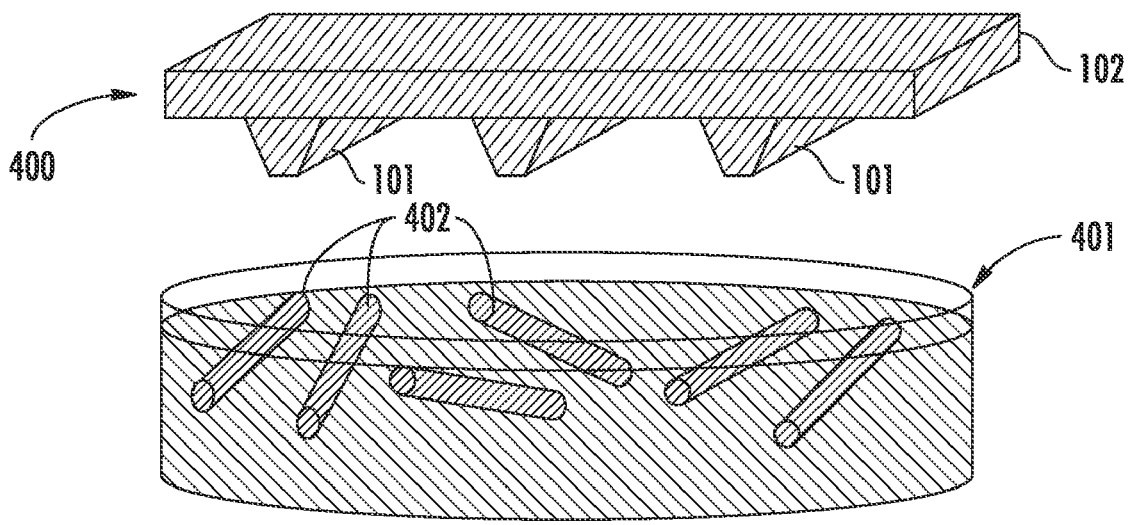
Figure 15:
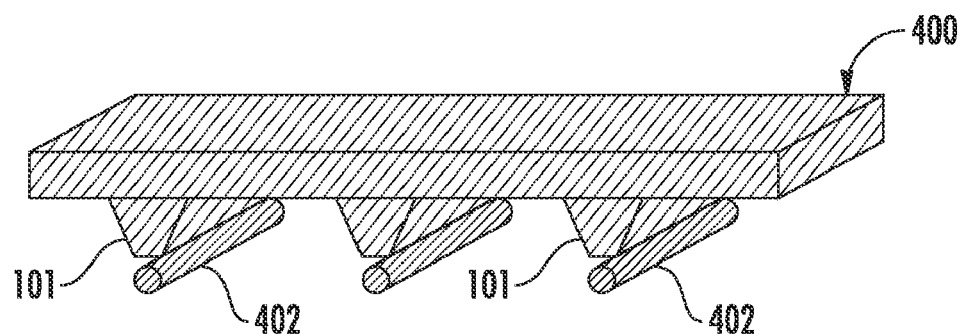

The points argued above also apply to the alternative embodiments of the present mold, just like the ones shown in particular in the example of FIG. 12-b) in which a mold 310a analogous to the mold of FIG. 12-a) but without the third layer is shown, and in the example of FIG. 13-a) in which a mold 310b analogous to the one of FIG. 12-b) however in which the first layer is discontinuous is shown, that is, obtained in the form of pads 3a as described previously.

The present mold, in the various embodiments described above is advantageously used to obtain an array of carbon nanotubes with a high control of their position. In particular, the present mold is used in some of its embodiments in a method for obtaining an array of horizontally arranged nanotubes, and in other embodiments in a method for obtaining an array of vertically arranged carbon nanotubes.

In the examples of FIGS. 14-18 schematically illustrated is the first of the abovementioned two methods wherein for simplification purposes a mold 400 is shown in a manner limited to the layer comprising the first projections being well understood that actually it could also comprise the second and possibly the third layer as described previously. The method comprises providing a mold 400 of the type considered above, comprising a first layer 102 of a first preset material having a surface having in relief at least a plurality of first projections 101 arranged according to a preset pattern having a free end portion with substantially pointed profile, wherein such first projections have a length comprised between 10 nm and 10 microns and a width comprised between 5 nm and 100 nm.

The method includes providing a dispersion 401 of functionalized carbon nanotubes 402 having dimensions comparable to the dimensions of the abovementioned first projections 101 and wetting the abovementioned first projections 101 in the dispersion 401, that is bringing such first projections into contact with such dispersion, in such a manner that to first projections 101 adhere respective carbon nanotubes 402. The method also includes assisted deposition, through the abovementioned mold 400, of the carbon nanotubes 402 on a substrate 500 thus obtaining the abovementioned array of horizontally arranged carbon nanotubes.

Figure 17:
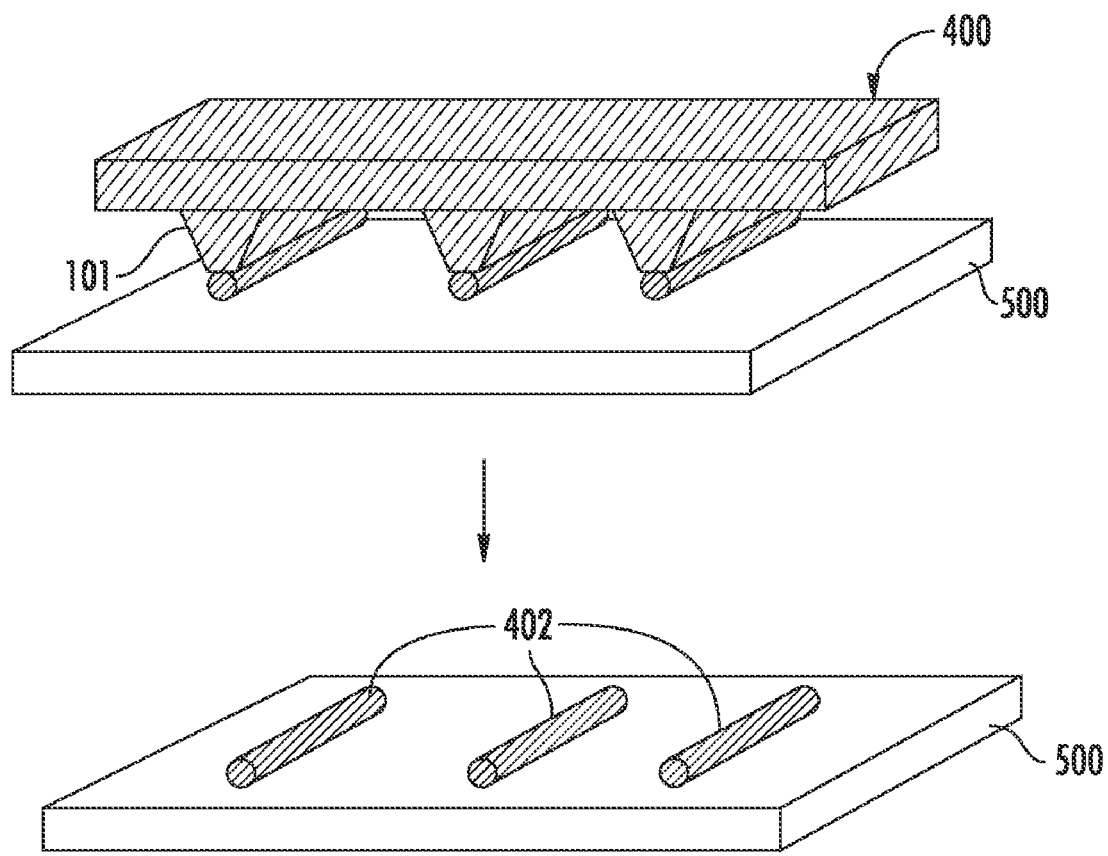

According to an embodiment, the carbon nanotubes 402 are deposited by means of contact molding, as illustrated in the example of FIG. 17. In such case, the abovementioned mold 400, and in particular the first projections of the mold are not required to have particular conductive properties and they can also be insulating, as mentioned beforehand.

It should be observed that the adhesion between the mold and the nanotubes occur spontaneously in a manner depending on the structure or the pattern of the mold, that is, depending on the first projections. The first projections of the present mold, as described previously, have an end portion with substantially pointed profile at which the high curvature generates high surface energy useful for the adhesion of functionalized carbon nanotubes.

According to an alternative embodiment illustrated in the example of FIG. 18 regarding the final step of the abovementioned method, the substrate on which the array is obtained is made of oxidizable material. In particular, in FIG. 18, 501 is used to indicate the abovementioned substrate which comprises an upper surface made of such oxidizable material, advantageously silicon.

In such embodiment of the present method, the carbon nanotubes 402 are deposited through a growing step on the substrate 501, then on the carbon nanotubes 402 themselves, of an oxide layer. The oxide layer practically fixes the carbon nanotubes mechanically on the substrate 501, as shown in the example of FIG. 18, wherein carbon nanotubes 403 can be observed covered by the oxide layer.

In particular, in such case, the mold comprises first projections 101a conductive and electrically connected to each other, and the oxide layer is grown through local oxidation applying a voltage impulse between such first conductive projections 101a and the substrate 501 in a highly wet environment. In a highly wet environment the application of a voltage impulse between the first conductive projections and a substrate positioned at a limited preset distance from the first projections, or even also at contact with the nanotubes attached on them, polarises the water molecules in vapour phase and the ones adsorbed on the surface of the substrate.

When the voltage impulse reaches and exceeds a given threshold value a water meniscus is formed between the first projections and the substrate, induced by the generated electric field. In this case, the first projections serve as a cathode and the water meniscus provides the electrolyte for producing the oxidation of the substrate surface.

The oxidation of the substrate generates the abovementioned oxide layer which encloses and locks the carbon nanotubes on the substrate itself. It should be observed that such embodiment is particularly advantageous in case of applications of the transistor type, in which nanotubes substantially covered by an oxide layer, just like the ones obtained in the example of FIG. 18 are required.

In a preferred embodiment, it is possible to operate in such a manner that each first projection of the mold is occupied by a respective nanotube perfectly aligned to it. In fact, to prevent a nanotube from occupying, so to say, only a portion of the relative first projection, thus remaining hanging therefrom, the present method involves, following the step of wetting the first projections in the dispersion, the further step of removing any carbon nanotubes not entirely adherent to a respective first projection by subjecting the mold to an electric field (E), and thus repeating the step of wetting the first projections of the mold in the dispersion, as illustrated in the example of FIG. 16 in which carbon nanotubes 402 not entirely adherent to respective first projections are shown along with the application of an electric field for their removal.

The abovementioned last two steps of removal by means of an electric field and wetting can be repeated n times until each projection is coupled with a respective nanotube substantially entirely and perfectly aligned with it.

What occurs in this case is that the adhesion force between a nanotube not perfectly aligned with a relative first projection and the projection itself is lower than the adhesion force in case of a perfectly aligned nanotube, i.e. when the contact interface is maximum.

Such difference of forces is exploited to remove possible poorly arranged nanotubes through the abovementioned uniform electric field which is substantially applied vertically with respect to the mold. By modulating the intensity of the electric field it is possible to remove possible nanotubes even differently but still poorly arranged on the projections which have a lower adhesion to the mold.

By repeating such procedure, intermitted by relative dipping (wetting) of the first projections of the mold into the dispersion of nanotubes, it is possible to obtain that each projection be occupied by a nanotube exploiting the entire front surface available for the projection itself. In any case, in the embodiments described above, in order to optimise the realization of a stable dispersion the nanotubes used are functionalized, for example with surfactants or DNA molecules, or also through covalent functionalizations.

The surfactants among which sodium dodecyl sulfate (SDS) is included are preferred. Furthermore it is also possible to provide for a functionalization of the substrate and of the first projections of the mold, to be selected depending on the functionalization of the carbon nanotubes.

The abovementioned method, as mentioned above regarding the layers of the mold, can be performed using rigid, soft and also the combined rigid/soft type of molds as described previously. The main advantage of the method described above lies in the fact, that due to the use of the present mold, the realized array comprises carbon nanotubes arranged horizontally in a highly controlled manner due to a highly assisted parallel deposition.

Therefore, through a low cost method, an array comprising carbon nanotubes the deposition of which, at particularly accurate positions, can be advantageously performed both in organic and inorganic substrates is obtained. Furthermore, given that direct growth of nanotubes from the substrates is not required, the present array can be advantageously obtained at particularly low process temperatures.

It should be observed that in the examples indicated above the horizontally arranged carbon nanotubes are shown aligned and parallel to each other according to the mold used; however, when required it is possible to use a mold with a pattern in which the first projections are realized in such a manner to obtain an array of carbon nanotubes arranged horizontally but not parallel to each other.

Figure 19:
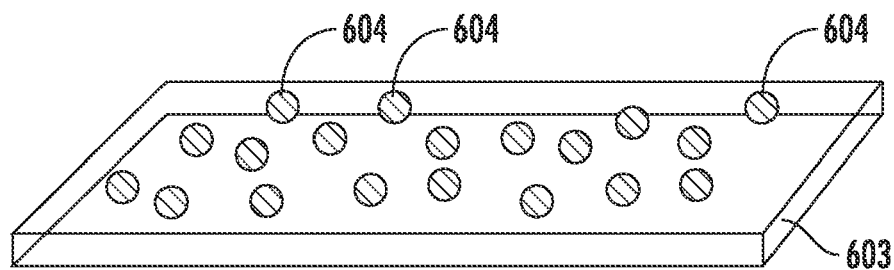
FIGS. 19-24 schematically show a method according to the invention for obtaining, on a substrate, an array of vertically arranged carbon nanotubes.
Figure 20:
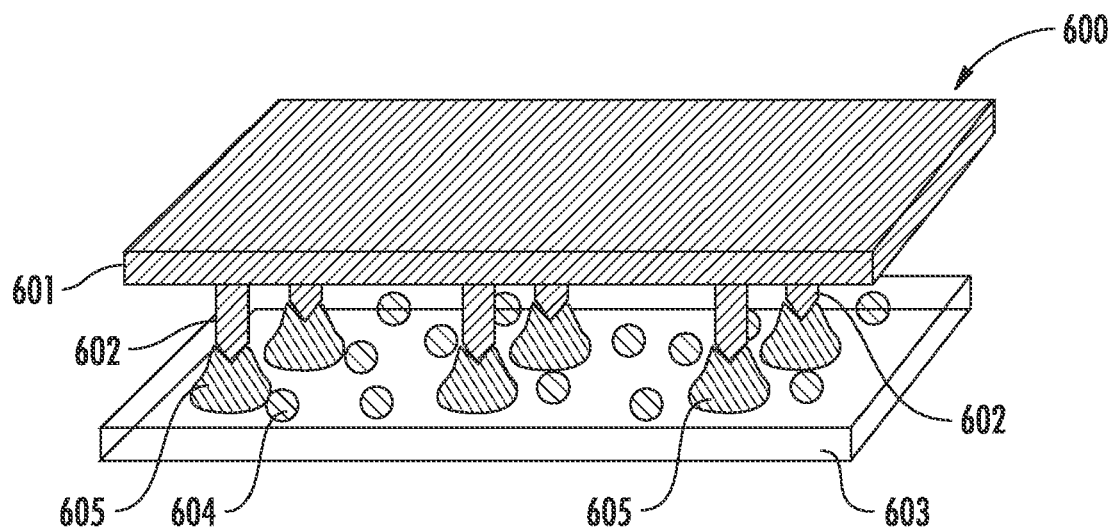
Figure 21:
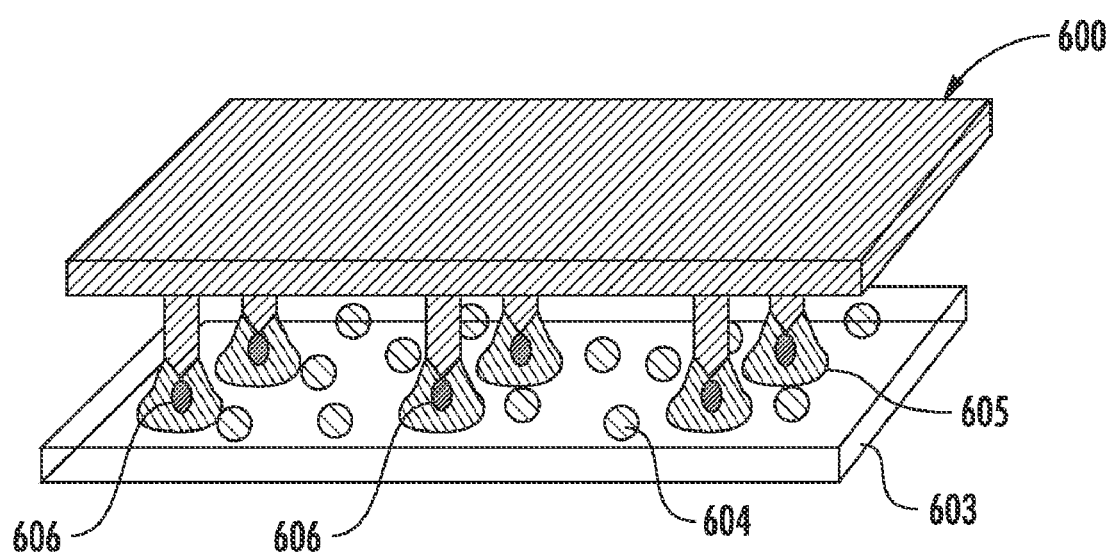
Figure 22:
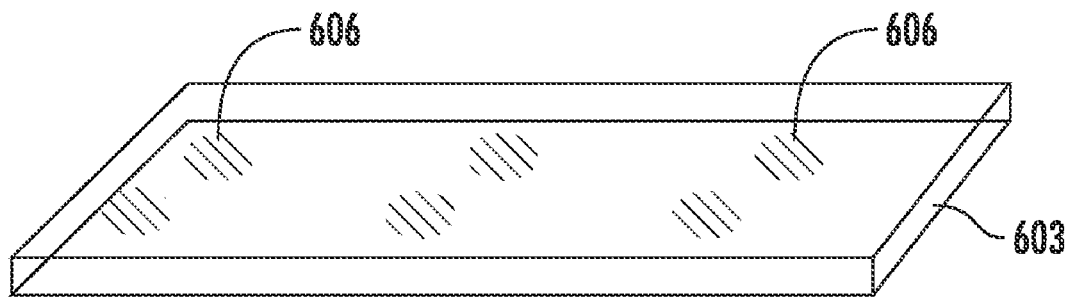
Figure 23:
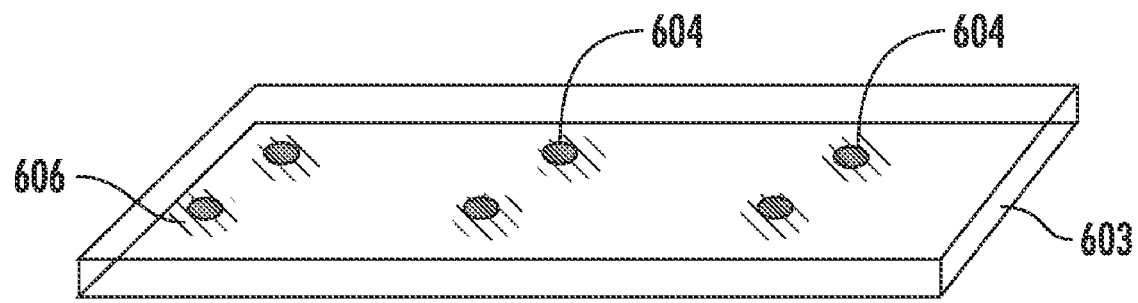
Figure 24:
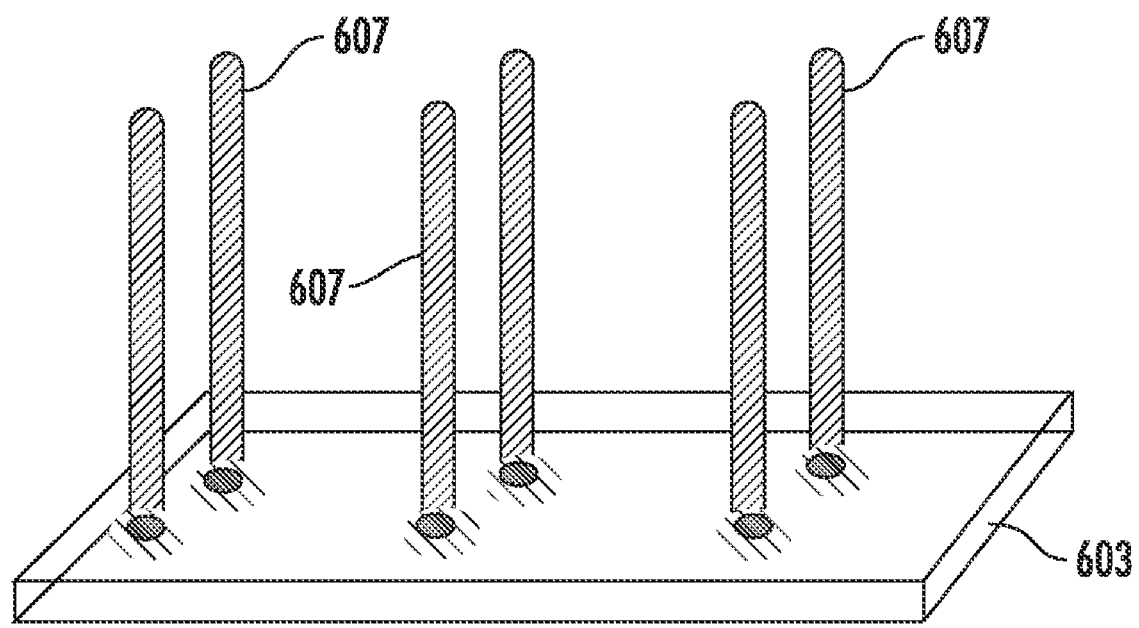

In order to obtain, on a substrate, an array of carbon nanotubes parallel to each other and arranged vertically, a method, schematically illustrated in the example of FIGS. 19-24, is advantageously used in which a mold of the type described previously, which for simplification purposes is shown in a manner limited to a first layer only comprising first conductive projections. The method comprises providing a mold 600 comprising a first layer 601 of a first preset material having a surface having in relief at least a first plurality of projections 602 arranged according to a preset pattern, in which such first projections 602 are conductive, electrically connected to each other, and have a free end portion with substantially pointed profile having a curvature radius comprised between 5 nm and 100 nm. A substrate 603 having an oxidizable or partially oxidized upper surface with a native oxide film is provided. The method further includes depositing on the substrate 603 a uniform layer of catalytic nanoparticles 604 having the same radius substantially entirely covering at least a preset portion of such substrate surface 603 (FIG. 19). The mold 600 is arranged in a highly wet environment, at a preset spaced relation with the substrate surface portion covered by the catalytic nanoparticles layer 604 up to the formation between each first projection 602 and an underlying respective nanoparticle 604 of a water meniscus 605, analogously to the points already described (FIG. 20). A voltage impulse is applied between the abovementioned first projections 602 and the abovementioned substrate surface portion, generating at each water meniscus 605 an oxide layer 606 on each relative catalytic nanoparticle 604 with its fixation on the substrate 603 (FIG. 21). The catalytic nanoparticle portion 604 not fixed on the abovementioned substrate surface portion is selectively removed, thus obtaining a pattern of catalytic nanoparticles 604 corresponding to the pattern of the first projections 602 of the mold 600 (FIG. 22). The catalytic nanoparticles 604 fixed onto the substrate 603 are subjected to a controlled etching to partially remove from each nanoparticle the oxide layer 606 with the relative partial exposure of each particle (FIG. 23). The method also includes growing from the catalytic nanoparticles 604 from the abovementioned pattern of nanoparticles the respective carbon nanotubes 607 by means of the CVD technique, obtaining the abovementioned array of vertically arranged carbon nanotubes 607 (FIG. 24). Preferably, the CVD (chemical vapour deposition) technique is a PECVD (plasma enhanced CVD) technique performed with plasma.

With regard to the selective and partial removal of the oxide layer formed on the catalytic nanoparticles, it should be added that it is preferably obtained by means of an anisotropic etching, for example by means of plasma.

In practice, the aim is to free a limited portion of each catalytic nanoparticle from the oxide layer, in such a manner that it can serve as a catalytic crystallization nucleus, but simultaneously leaving the catalytic nanoparticle substantially, mechanically, fixed to the substrate through the oxide layer itself. A gas mixture which allows a non-aggressive etching, of the oxide layer, for example $F_2/Ar$, is therefore preferred. Advantageously, it is possible to obtain an array with a density of carbon nanotubes even greater than the density of the first projections present on the mold.

In this case, the present method involves the repetition of the abovementioned steps of forming the water meniscus and oxidation of the relative catalytic nanoparticles n number of times, substantially horizontally moving each time of such n times the relative position between the mold and the substrate, that is, the abovementioned preset spaced relation is realized with relative different horizontal positions between the mold and the surface covered by catalytic nanoparticles.

Figure 25:
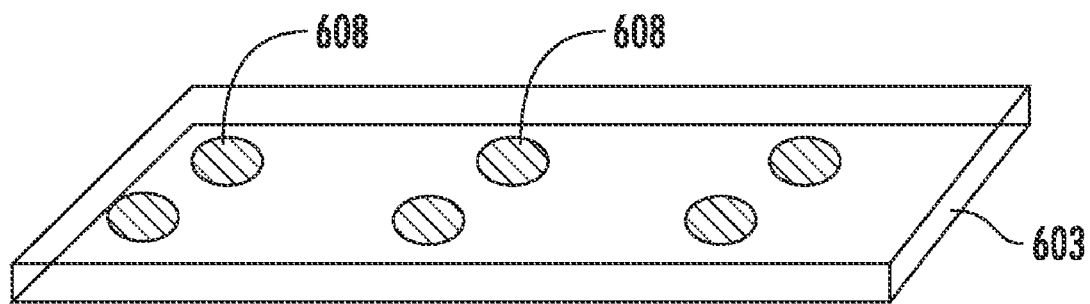
FIGS. 25-27 schematically show another embodiment of the method illustrated in FIGS. 19-24.
Figure 26:
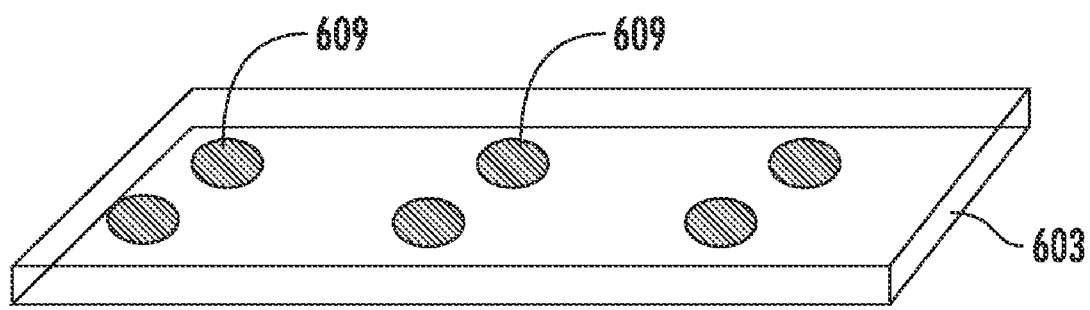
Figure 27:
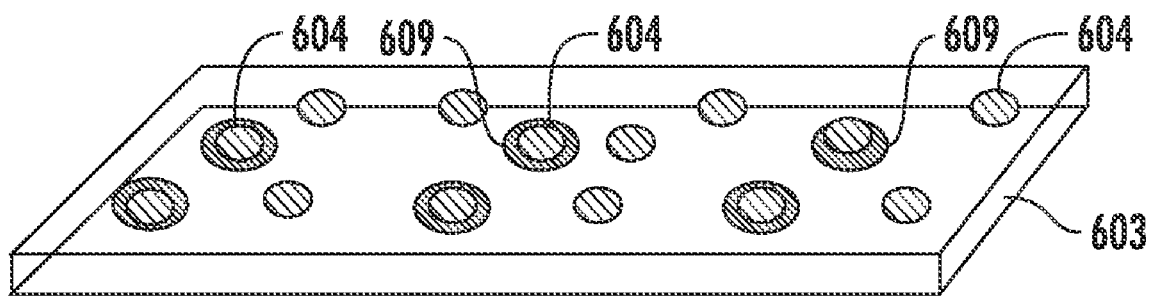

According to a schematised embodiment in the example of FIGS. 25-27, the abovementioned upper surface of the partially oxidized substrate is a surface functionalised and locally oxidized through a relative local oxidation step in which a plurality of oxide spots 608 according to the pattern of the mold 600 (FIG. 25) is realized on the upper surface of the substrate. The method further comprises, before the step of depositing the abovementioned layer of catalytic nanoparticles 604 on the substrate 603, the further step of selectively etching and removing the abovementioned oxide spots 608 obtaining a relative pattern of cavities 609 cut in the abovementioned upper portion of the substrate 603 (FIG. 26). Then, indistinctively before or after depositing the layer of catalytic nanoparticles, the further step of aligning the pattern of the mold 600 to the pattern of the cavity 609 of the substrate 603.

In this case, the abovementioned cavities 609 form energetically favoured positions for the deposition of catalytic nanoparticles 604 (FIG. 27) and they shall be substantially occupied by a respective catalytic nanoparticle.

Preferably, the abovementioned locally oxidised surface portion of the substrate, that is its local oxidation, is obtained by applying a voltage impulse between the projections of the mold and the same surface portion in a highly wet environment, analogously to the points argued previously. Still, the present method may comprise, before the deposition of the layer of catalytic nanopoarticles, the further steps of locally growing a native oxide layer in the abovementioned cavities 609.

In this case, the localization and arrangement of the particles in the cavities is additionally favored. Advantageously the points described above made particularly effective due to the above-mentioned functionalization of the substrate which is advantageously realized in such a manner that chemical species having an —NH2 termination are bonded to the abovementioned upper surface portion of the substrate.

In fact, such a functionalization, if on one side it prevents the formation of native oxide on the substrate, on the other it can be locally removed at the abovementioned cavities following the local oxidation induced by the electric field in a wet environment.

In practice, what occurs is the removal of the functionalization terminating with the —$NH_2$ groups in a manner limited to the oxide spots obtained through the voltage impulse, then there is the removal of the same oxide spots formed with relative realization of the abovementioned cavities, and then the formation of the native oxide layer locally and limited to the cavity.

The substrate surface portion outside the cavities is thus still functionalised with the —NH$_2$ terminations, while inside the cavities there is a native oxide layer, which favours the subsequent deposition of the catalytic nanoparticles inside the same cavities. This is highly facilitated by the poor affinity the catalytic nanoparticles have for —NH$_2$ groups and by the high affinity they have, on the contrary, for the oxide.

Preferably, the catalytic nanoparticles have a diameter comprised between 1 nn and 200 nm, even more preferably comprised between 1 nm and 50 nm. Advantageously, the abovementioned deposition of catalytic nanoparticles is performed starting from a dispersion of nanoparticles in a preset solvent, or alternatively by using a synthetic DNA lattice. Still preferably, an inhibitor layer, advantageously oleic acid, covers the catalytic nanoparticles.

It is worth noting that the catalytic nanoparticles are initially deposited on the substrate in such a manner that they do not aggregate with each other and somehow adhere to the substrate itself, depending on the adhesion force involved which depends on the different chemical properties of the material forming the substrate and the catalytic nanoparticles.

The selective removal of the particles not fixed through the oxide onto the substrate, can be obtained by intervening on the abovementioned adhesion force, for example through the use of a liquid (solvent) in a washing step through which the substrate/nanoparticle adhesion is lowered.

The abovementioned method for obtaining an array of vertically arranged carbon nanotubes, as aforementioned, can be realized by means of rigid, soft and also the combined rigid/soft types of molds, possibly also comprising a second plurality of the spacer type of projections taller than the first projections, as described previously.

The main advantage of the method described above lies in the possibility of first obtaining a preset catalytic pattern, comprising catalytic sites (catalytic nanoparticles) with highly controlled positions and dimensions, at a particularly low cost given that expensive techniques such as advanced lithography processes are not used.

Therefore, the present method allows obtaining, through a parallel execution, an array of carbon nanotubes parallel to each other and arranged vertically, with high control of their positioning and also of their dimensions, in particular of the radius, which basically depends on the dimensions of the catalytic sites obtained on the substrate.

In particular, it should be observed that the catalytic sites are not influenced by limits given by the lithography processes given that they depend on the initial dimensions of the catalytic nanoparticles which can be initially of dimensions reduced to a few nanometres. Therefore, advantageously, growth of carbon nanotubes, even with a single wall, is allowed.

An effective control on the positioning on a substrate of a plurality of nanotubes is substantially required in electronic applications using carbon nanotubes, such as for example in transistors and in the probe memories. Furthermore, also the control of the radius of the carbon nanotubes, both in terms of dimension and uniformity in the array is particularly important in most electronic applications widely requested.

Regarding this, it is useful to emphasise that the present method allows obtaining carbon nanotubes through a parallel approach, having a high control of their positioning, and also having a high control of the dimension and of the uniformity of the nanotubes.

The combination of the points discussed above is useful for understanding the differences over what is provided in the prior art. As a matter of fact, the prior art, though widely dealing with processes related to the realization and use of nanotubes, does not meet or does not fully meet the double need linked to the control of the positioning and of the dimensions (uniformity and size) of carbon nanotubes.

Therefore, advantageously, arrays of nanotubes obtained according to these embodiments have interesting applications in many electronic products, for example as field emitters (display, manufacturing low cost photomasks, compact microwave amplifiers, gas sensors), in probe memories, in the photonic technology industry, in transistors, biosensors etc.

Figure 28:
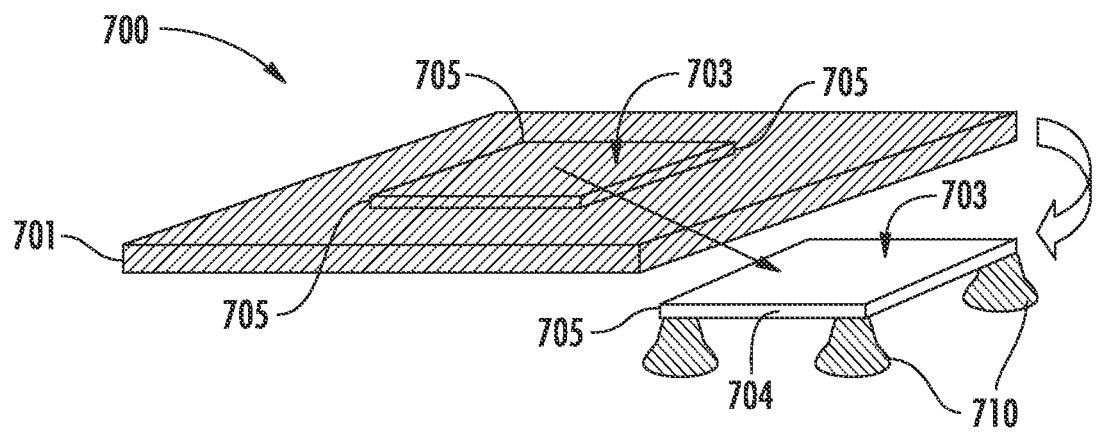
FIGS. 28 and 29 schematically show a mold for obtaining, on a substrate, an array of vertically arranged carbon nanotubes according to other embodiments of the present invention.

Still, according to an alternative embodiment, the present method for obtaining an array of vertically arranged carbon nanotubes, can be realized by means of a mold illustrated schematically in the example of FIG. 28. In such figure, a mold indicated in its entirety with 700, comprises a first layer 701 with an upper surface 702 having a first projection 703 having a side wall 704 substantially perpendicular to such upper surface 702, which identifies a plurality of corners 705.

In the example of the figure the mold 700 comprises one first substantially square-shaped projection 703, therefore four corners 705, but it is understood that the present mold may comprise a greater number of first projections even of a different shape and therefore with a greater number of corners.

Figure 29:
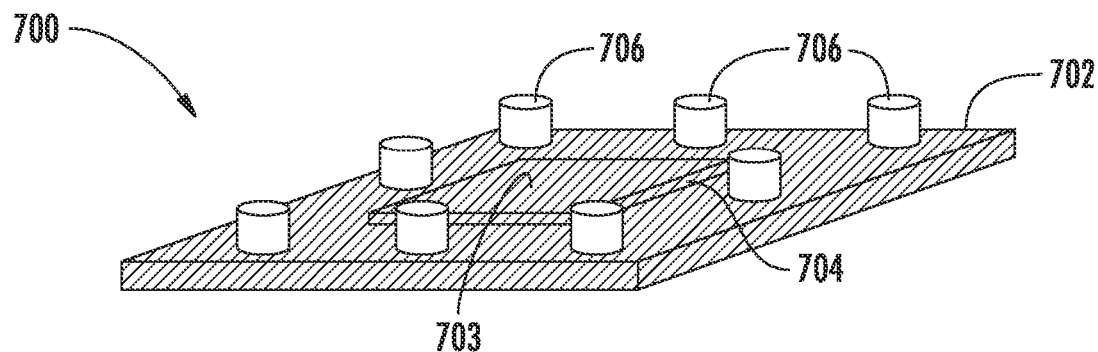

Furthermore, as shown in the example of FIG. 29, the mold 700 may also comprise a plurality of second projections 706 taller than the first projection 703, i.e. projections of the spacer type considered previously with reference to the different embodiments of the mold already described herein.

In this case, the first projection 703 may not have an end portion with a substantially pointed profile, therefore the mold, and in particular the abovementioned first layer of the mold, can be advantageously made starting from templates obtained with less intense processes that comprise, moreover, fewer realization steps.

More precisely, a soft mold, made of polymer material, is manufactured through simple replica on a rigid template having a complementary structure which can be used for a high number of times. Also in this embodiment of the mold, analogously to the points argued previously, the second projections (spacers) are insulating while the first projection is electrically conductive and therefore makes also the abovementioned corners conductive and electrically connected.

The electric conductivity can be obtained by metallizing the upper surface of the first layer thus the first projection and not metallizing the abovementioned spacers. Advantageously such metallization can be obtained by means of a thin metal film or by means of an appropriate metal mask arranged on the upper surface of the mold.

Obviously, a first soft layer can possibly be supported on the lower part by a second layer not shown in the figures. In any case, the mold 700, is used in a method for obtaining, on a substrate, an array of carbon nanotubes parallel to each other and arranged vertically.

Such method, during the performance of its steps, is similar to the method described above for obtaining an array of vertically arranged carbon nanotubes except for the fact of using a different mold. In this case, the growth of nanotubes at highly localised positions occurs by exploiting the abovementioned corners 705 of the first projection 703, given that at such corners, analogously to points illustrated previously and as shown in the detail of FIG. 28 the formation of a water meniscus 710 can be obtained, therefore the oxidation of the catalytic nanoparticles, their locking on the substrate and the relative growth of nanotubes with a high control of their positioning.

Therefore, regarding the detailed description of the use of such mold, reference shall be made to the points illustrated previously with reference to a mold comprising first projections substantially in form of rods.

Obviously, to the embodiments of the invention described above, in order to satisfy specific and contingent needs, a man skilled in the art can make numerous modifications all moreover contained within the scope of protection of the invention, as defined by the following claims.

That which is claimed is:

1. A method for making a mold for forming an array of carbon nanotubes comprising:
    providing a substrate having an upper surface, with the substrate comprising a SOI wafer comprising an upper silicon layer and a lower oxide layer, with the upper surface being an upper surface of the upper silicon layer;
    thermally growing, on the upper surface, a first layer of thermal oxide;
    forming, on the first layer of thermal oxide, a layer of photosensitive material;
    forming, on the layer of photosensitive material, a pattern through lithography patterning;
    developing the layer of photosensitive material and etching the first thermal oxide layer to obtain a thermal oxide mask with a geometry corresponding to the pattern;
    selectively etching the upper surface of the substrate to obtain, beneath the mask, a first plurality of projections having sloping side walls;
    etching the first plurality of projections having sloping side walls using plasma etching;
    thermally growing, on the upper surface, a second oxide layer to further etch the first plurality of projections having sloping side walls;
    selectively removing said second thermal oxide layer and said mask thus freeing said upper surface of said substrate obtaining a first plurality of projections thereon, each having an end with a pointed profile;
    selectively etching the lower oxide layer;
    forming a third layer comprising silicon on the selectively etched lower oxide layer; and
    coupling the upper silicon layer comprising the first plurality of projections to a metallized surface of a layer of a polymer supported by the third layer.

2. A method according to claim 1, further comprising, after selectively etching the lower oxide layer, the following:
    coupling, with a photosensitive glue layer, the upper silicon layer comprising the first plurality of projections having an end with a substantially pointed profile to a metallized surface of the layer of the polymer; and
    making the upper silicon layer discontinuous by forming a plurality of pads thereon, each comprising a respective projection of the first plurality of projections, the pads being separated by a distance between 500 nm and 1 mm.

3. A method according to claim 1, wherein the end portion of the first plurality of projections has a length between 10 nm and 10 microns.

4. A method according to claim 3, wherein the length is between 10 nm and 100 nm.

5. A method according to claim 1, wherein projections of the first plurality thereof each have a height between 300 nm and 1 microns.

6. A method according to claim 5, wherein the height is between 100 nm and 10 microns.

7. A method according to claim 5, wherein projections of the first plurality thereof each have a curvature radius between 5 nm and 100 nm.

8. A method according to claim 5, wherein projections of the first plurality thereof each have a pointed end portion of substantially a same width.

9. A method according to claim 8, wherein the width is between 5 nm and 20 nm.

10. A method according to claim 1, further comprising, after selectively etching the lower oxide layer, coupling, with a photosensitive glue layer, the upper silicon layer comprising the first plurality of projections having an end with a substantially pointed profile to the layer of the polymer.

11. A method according to claim 10, further comprising:
    making the upper silicon layer discontinuous by forming a plurality of pads thereon, each comprising a respective projection of the first plurality of projections, the pads being separated by a distance between 500 nm and 1 mm; and
    electrically coupling said plurality of pads to each other through a metal mask having a geometry corresponding to the pattern.

12. A method according to claim 10, wherein a second plurality of projections is formed, projections of the second plurality thereof being taller than projections of said first plurality thereof.

13. A method according to claim 12, wherein a height difference between the projections of the second plurality and the projections of the first plurality is between 10 nm and 100 nm.

14. A method according to claim 13, wherein the height difference is between 15 nm and 30 nm.

15. A method according to claim 12, wherein the projections of the second plurality of projections each have an end portion of a width between 10 nm and 200 nm.

16. A method according claim 12, wherein at least one projection of the first plurality of projections is surrounded by projections of the second plurality of projections.

17. A method according to claim 12, wherein the projections of the first plurality of projections are electrically conductive and the projections of the second plurality of projections are electrically insulating.

18. A method according to claim 17, wherein the upper silicon layer is a doped layer and the projections of the second plurality thereof are made selectively insulating through an oxygen implantation followed by a thermal treatment.

19. A method according to claim 17, wherein the first silicon layer is a non-doped layer made selectively conductive together with the projections of the first plurality of projections through an ion implantation step.

* * * * *